(12) United States Patent
Tu et al.

(10) Patent No.: US 11,978,706 B2
(45) Date of Patent: May 7, 2024

(54) ELECTRONIC PACKAGE STRUCTURE, ELECTRONIC SUBSTRATE AND METHOD OF MANUFACTURING ELECTRONIC PACKAGE STRUCTURE

(71) Applicant: Advanced Semiconductor Engineering, Inc., Kaohsiung (TW)

(72) Inventors: Shun-Tsat Tu, Kaohsiung (TW); Pei-Jen Lo, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 154 days.

(21) Appl. No.: 17/460,051

(22) Filed: Aug. 27, 2021

(65) Prior Publication Data
US 2023/0061684 A1 Mar. 2, 2023

(51) Int. Cl.
*H01L 23/544* (2006.01)
*H01L 23/00* (2006.01)

(52) U.S. Cl.
CPC .......... *H01L 23/544* (2013.01); *H01L 24/03* (2013.01); *H01L 24/06* (2013.01); *H01L 24/08* (2013.01); *H01L 24/20* (2013.01); *H01L 24/80* (2013.01); *H01L 2223/54426* (2013.01); *H01L 2224/0213* (2013.01); *H01L 2224/0362* (2013.01); *H01L 2224/06515* (2013.01); *H01L 2224/08225* (2013.01); *H01L 2224/80031* (2013.01); *H01L 2224/80047* (2013.01)

(58) Field of Classification Search
None
See application file for complete search history.

(56) References Cited

U.S. PATENT DOCUMENTS

| | | | |
|---|---|---|---|
| 8,432,022 B1* | 4/2013 | Huemoeller | H01L 24/19 257/659 |
| 2017/0033062 A1* | 2/2017 | Liu | H01L 23/528 |
| 2020/0058614 A1* | 2/2020 | Tung | H01L 21/6836 |

* cited by examiner

*Primary Examiner* — Nishath Yasmeen
(74) *Attorney, Agent, or Firm* — FOLEY & LARDNER LLP

(57) ABSTRACT

An electronic package structure, an electronic substrate, and a method of manufacturing an electronic package structure are provided. The electronic package structure includes a substrate. The substrate includes a bonding region and an alignment structure. The bonding region is located at a side of the substrate and configured to bond with an electronic component. The alignment structure is located at the side of the substrate and out of the bonding region and configured to providing a fiducial mark for position-aligning, wherein the alignment structure comprises a first region and a second region visually distinct from the first region.

11 Claims, 22 Drawing Sheets

ELECTRONIC PACKAGE STRUCTURE, ELECTRONIC SUBSTRATE AND METHOD OF MANUFACTURING ELECTRONIC PACKAGE STRUCTURE

BACKGROUND

1. Field of the Disclosure

The present disclosure relates to an electronic package structure, in particularly to an electronic package structure with a fiducial mark for position-aligning in a lithography operation.

2. Description of the Related Art

A hybrid bonded package has a top die hybrid bonded to a bottom die, and a planarization operation (e.g., chemical mechanical polishing) performed on the top surface of the bottom die prior to hybrid bonding provides a flat surface suitable for the subsequent bonding operation. When an interconnection or a conductive routing (e.g., conductive pillars or conductive pads) is to be formed over the aforesaid flat surface of the bottom die via a lithography operation, a sputtering layer covers the entire flat surface as a preparation layer is first formed. The flatness of said preparation layer carried from the morphology of the underlying flat surface of the bottom die leads to location registration problem with respect to optical imaging. The problem set forth can often be observed in die-to-wafer or chip-to-wafer packaging process.

SUMMARY

In some embodiments, an electronic package structure includes a substrate. The substrate includes a bonding region and an alignment structure. The bonding region is located at a side of the substrate and configured to bond with an electronic component. The alignment structure is located at the side of the substrate and out of the bonding region and configured to providing a fiducial mark for position-aligning, wherein the alignment structure comprises a first region and a second region visually distinct from the first region.

In some embodiments, an electronic substrate includes a bonding region and an alignment structure. The bonding region is located at a side of the substrate and configured to bond with an electronic component. The alignment structure is located at the side of the substrate and out of the bonding region. The alignment structure includes a step structure in a cross-section In some embodiments, a method of manufacturing an electronic package includes: (a) providing a substrate having a first side; (b) disposing an electronic component on the first side of the substrate; (c) forming an alignment structure on the first side of the substrate; (d) sputtering a seed layer; and (e) performing an alignment operation of the substrate by using the alignment structure as a fiducial mark.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
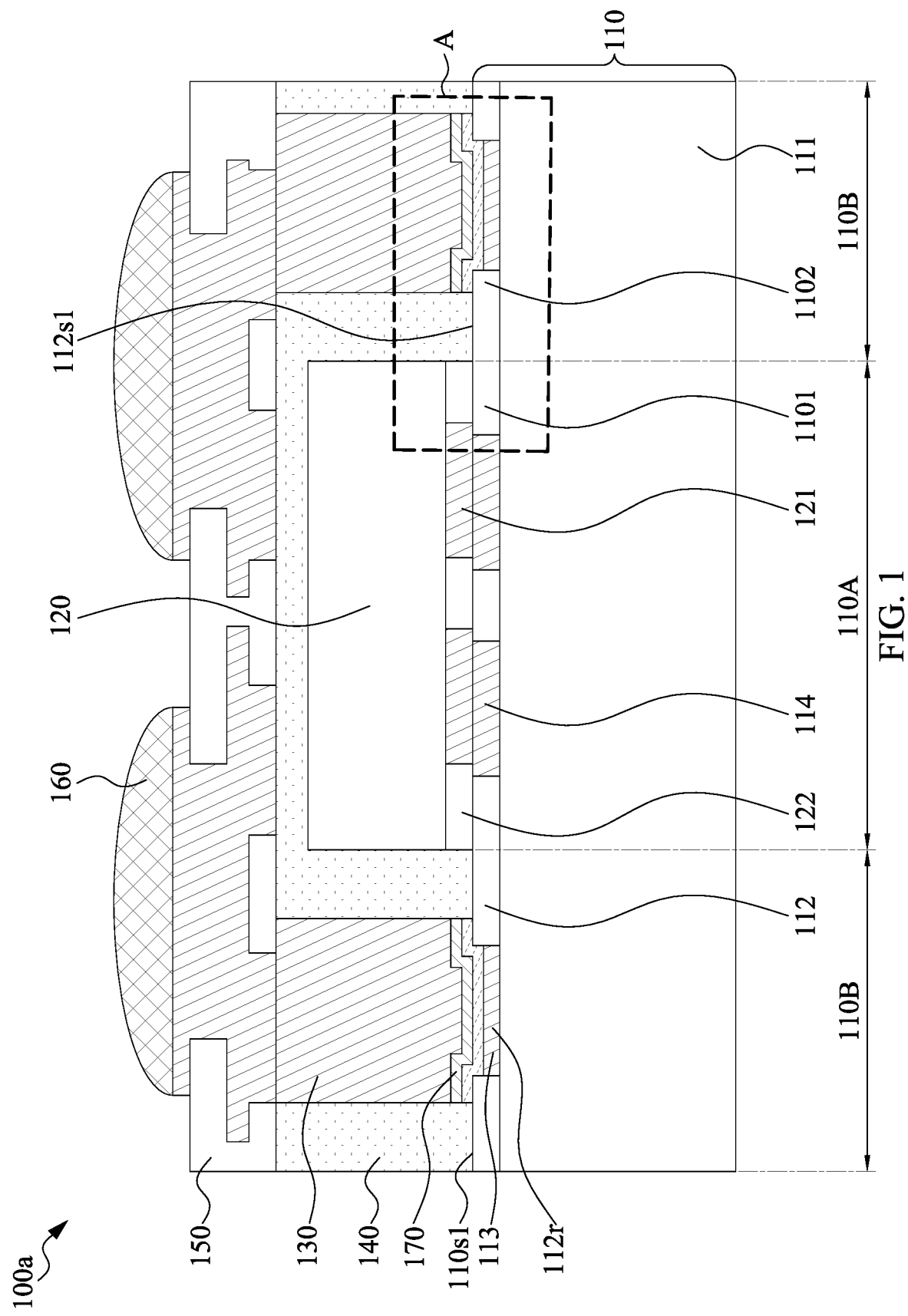
FIG. 1 is a cross-section of an exemplary electronic package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

A hybrid bonded package has a top die hybrid bonded to a bottom die. Since the surface roughness of the bottom die may affect the yield of hybrid-bonding the top die to the bottom die, a planarization operation may be performed on the bottom die before hybrid-bonding to ensure that the top surface of the bottom die may have a relatively smooth top surface. In some embodiments, a preparation layer is formed on the top surface of the bottom die by a lithography operation after the hybrid-bonding. Since the top surface of the bottom die is relatively smooth, the preparation layer may accordingly form a relatively top smooth surface over the top surface of the bottom die, which may result in failure of the alignment operation during a lithography operation. In some embodiments, a fiducial mark is formed on the top surface of the bottom die to facilitate the lithography operation. In some embodiments, the fiducial mark can be identified by forming a step structure on the top surface of the bottom die.

FIG. 1 is a cross-section of an exemplary electronic package structure 100a according to some embodiments of the present disclosure.

In some embodiments, the electronic package structure 100a may include a substrate 110, an electronic component 120, a conductive pillar 130, an encapsulant 140, a redistribution structure 150, an electrical connector 160, and a preparation layer 170.

The substrate 110 may include an electronic component, such as active components and/or passive components. The active component may include a semiconductor die or a chip, such as a logic die (e.g., application processor (AP), system-on-a-chip (SoC), central processing unit (CPU), graphics processing unit (GPU), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies) or other active components. In some embodiments, the substrate 110 may include a plurality of transistors, diodes, or other active components. The transistor may include bipolar junction transistors or MOSFET, JFET or other transistors. The diode may include Zener diodes, photodiodes, Schottky diodes or other diodes. The passive component may include a capacitor, inductor, resistor, filter, diplexer, balun, or combination of such components. In some embodiments, the substrate 110 may include a wafer and have active and/or passive components formed therein. In some embodiments, the substrate 110 may also be referred to as an electronic component. In some embodiments, the substrate 110 may include an electronic substrate.

The substrate 110 may include a side 110s1. In some embodiments, the substrate 110 include a bonding region 110A and an alignment structure 110B out of the bonding region 110A. The bonding region 110A is located on the side 110s1 of the substrate 110. The alignment structure 110B is located on the side 110s1 of the substrate 110. In some embodiments, he substrate 110 may include a carrier 111, a dielectric layer 112, a pattern 113, and a pattern 114.

The carrier 111 may be a semiconductor substrate. The carrier 111 may include silicon or germanium in a single crystal form, a polycrystalline form, or an amorphous form.

The dielectric layer 112 may be disposed on the carrier 111. The dielectric layer 112 may include oxide, nitride, oxynitride, or other suitable materials. In some embodiments, the dielectric layer 112 may define a plurality of openings 112r for accommodating the pattern 113, and the pattern 114. The dielectric layer 112 surrounds the pattern 113 and the pattern 114. The dielectric layer 112 may include a surface 112s1 (or a top surface).

The pattern 113 may be located in a region 1102 of the side 110s1. The pattern 113 is exposed by the opening 112r of the dielectric layer 112. In some embodiments, the pattern 113 may include a terminal (or an outer I/O). The pattern 113 may be disposed within the openings 112r defined by the dielectric layer 112 and surrounded by the dielectric layer 112. In some embodiments, the pattern 113 is configured to connect the conductive pillar 130. In some embodiments, the pattern 113 may be exposed by the electronic component 120. In some embodiments, the pattern 113 may include a pad which is configured to electrically connect an exterior circuit, such as the redistribution structure 150.

The pattern 114 may be located in a region 1101 of the side 110s1. The pattern 114 may be disposed within the openings 112r defined by the dielectric layer 112 and surrounded by the dielectric layer 112. The pattern 114 may be configured to electrically connect the electronic component 120. The pattern 114 may be covered by the electronic component 120. The pattern 114 may also be referred to as an inner I/O. In some embodiments, the pattern 114 may include a pad which is configured to electrically connect an interconnector of the electronic component 120.

The bonding region 110A is configured to bond an electronic component, such as the electronic component 120. The alignment structure 110B is configured to perform an alignment operation to the substrate 110. In some embodiment, the alignment structure 110B includes a first region and a second region. In some embodiments, the first region and the second region are visually distinct from each other. In some embodiments, the second region can be visually distinct from the first region by human inspection or machine inspection (e.g., charge-coupled device (CCD)). For example, a programmed algorithm that instructs any machine to differentiate the pattern or feature of the first region from that of the second region would be encompassed in the scope of the present disclosure. In some embodiments, a machine such as CCD can recognize different morphologies crossing a step profile because the photons reflected by a sidewall of the step profile will not enter the CCDs and be detected by the pixels, and hence the a boundary of the step profile can be visualized in a color darker than that in other more planar regions. In some embodiment, the first region includes conductive material(s), such as the pattern 113, which may include metal. In some embodiment, the second region includes dielectric material, such as the dielectric layer 112.

The electronic component 120 may be disposed on the substrate 110. In some embodiments, the electronic component 120 may be directly bonded to the substrate 110. The electronic component 120 may be electrically connected to the substrate 110. The electronic component 120 may include active components and/or passive components. In some embodiments, the electronic component 120 may include a semiconductor die or a chip. In some embodiments, the electronic component 120 may be hybrid bonded to the substrate 110. In some embodiments, when the electronic component 120 is a semiconductor die with a die size smaller than that of the substrate 110, the thickness of the substrate 110 is greater than a thickness of the electronic component 120.

The electronic component 120 may include an interconnector 121 and a dielectric layer 122. The interconnector 121 may be disposed within the openings defined by the dielectric layer 122 and surrounded by the dielectric layer 122. The interconnector 121 may include a seed layer (not shown) and a conductive layer (not shown) surrounded by the seed layer. The seed layer may include conductive materials, such as metal, metal oxide, metal nitride or other suitable materials. For example, the seed layer may include titanium nitride. The conductive layer may include conductive materials, such as copper, gold, tin, aluminum, silver, tungsten, nickel, or a combination thereof. In some embodiments, the interconnector 121 of the electronic component 120 may be electrically connected to the pattern 114 of the substrate 110. In some embodiments, the interconnector 121 of the electronic component 120 may bond with the pattern 114 of the substrate 110. In some embodiments, the interconnector 121 of the electronic component 120 may contact the pattern 114 of the substrate 110. In some embodiments, the interconnector 121 of the electronic component 120 may be partially misaligned with the pattern 114 of the substrate 110. The misalignment between the electronic components 110 and 120 can be observed in hybrid bonded packages, and the dimensions of the patterns 121 and 114 are often designed to tolerate such operational error. In other embodiments, the interconnector 121 of the electronic component 120 may be substantially aligned to the pattern 114 of the substrate 110.

The dielectric layer 122 may surround or be around the interconnector 121. The dielectric layer 122 may include oxide, nitride, oxynitride, or other suitable materials. The dielectric layer 122 may define a plurality of openings for accommodating the interconnector 121. In some embodiments, the dielectric layer 122 of the electronic component 120 is in contact with the dielectric layer 112 of the substrate 110.

The preparation layer 170 may be disposed on the substrate 110. The preparation layer 170 may be configured to assist in forming the conductive pillar 130 during an electroplating operation. In some embodiments, the preparation layer 170 may conformally cover the pattern 113 and a portion of the dielectric layer 112. In some embodiments, the preparation layer 170 may have a thickness greater than about 1 μm.

The conductive pillar 130 may be disposed on the preparation layer 170. The conductive pillar 130 may be electrically connected to the pattern 113 of the substrate 110. The conductive pillar 130 may be configured to electrically connect the substrate 110 and the redistribution structure 150. The conductive pillar 130 may include conductive materials, such as copper, gold, tin, aluminum, silver, tungsten, nickel, or a combination thereof. In some embodiments, the conductive pillar 130 is located above the alignment structure 110B. In some embodiments, the conductive pillar 130 may also be referred to as a pillar.

The encapsulant 140 may be disposed on the substrate 110. In some embodiments, the encapsulant 140 may encapsulate the electronic component 120. The encapsulant 140 may encapsulate the conductive pillar 130. In some embodiment, the encapsulant 140 may be made of molding material that may include, for example, a Novolac-based resin, an epoxy-based resin, a silicone-based resin, or other another suitable encapsulant. Suitable fillers may also be included, such as powdered $SiO_2$.

The redistribution structure 150 may be disposed on the encapsulant 140. The redistribution structure 150 may be electrically connected to the conductive pillar 130. The redistribution structure 150 may include at least one dielectric layer and conductive trace(s) as well as via(s) embedded in the dielectric layer. The redistribution structure 150 may also be referred to as an exterior circuit.

The electrical connector 160 may be disposed on the redistribution structure 150. The electrical connector 160 may be electrically connected to the substrate 110 through the redistribution structure 150 and the conductive pillar 130. In some embodiments, the electrical connector 160 may include a solder ball (e.g., Sn ball).

Figure 2:
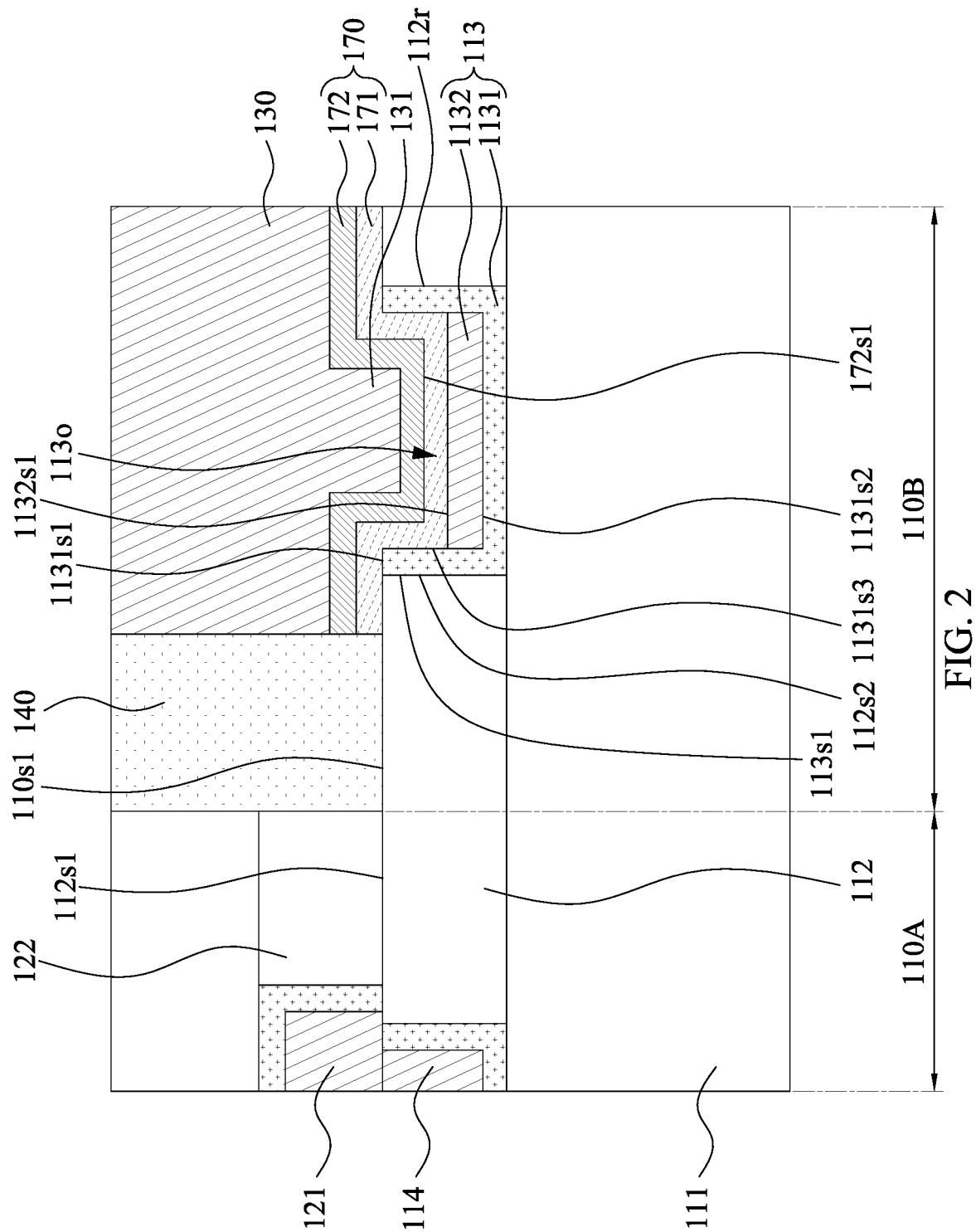
FIG. 2 is an enlarged view of region A of the electronic package structure as shown in FIG. 1, according to some embodiments of the present disclosure.

FIG. 2 is an enlarged view of region A of the electronic package structure 100a as shown in FIG. 1, according to some embodiments of the present disclosure.

In some embodiments, the pattern 113 may include a layer 1131 and a layer 1132.

The layer 1131 may include conductive materials, such as metal, metal oxide, metal nitride or other suitable materials. For example, the layer 1131 may include titanium nitride. The layer 1131 may include a surface 1131s1, a surface 1131s2, and a surface 1131s3. The surface 1131s1 (or a top surface) may be substantially coplanar with the surface 112s1 of the dielectric layer 112. The surface 1131s2 (or a top surface) is recessed from the surface 112s1 of the dielectric layer 112 so that the surface 1131s2 may have an elevation lower than that of the surface 1131s1. That is, the first region (e.g., the pattern 113) of the alignment structure 110B has a horizontal level or top elevation lower than that of the second region (e.g., the dielectric layer 112) of the alignment structure 110B. The surface 1131s3 (or a side surface) extends between the surfaces 1131s1 and 1131s2. The dielectric layer 112 has a surface 112s2 (or a side surface) extending from the surface 112s1. The pattern 113 has a surface 113s1 (or a side surface), which may be defined by the outer side surface of the layer 1131. In some embodiments, the surface 112s2 of the dielectric layer 112 is substantially coplanar or aligned with the surface 113s1 of the pattern 113. That is, a side surface of the second region (e.g., the dielectric layer 112) of the alignment structure 110B is substantially coplanar with a side surface of the first region (e.g., the pattern 113) of the alignment structure 110B. In some embodiments, the surface 112s2 can be regarded as the inner side surface of the opening 112r.

The layer 1132 may be disposed on the layer 1131. The layer 1132 may have a surface 1132s1 (or a top surface) located between the surfaces 1131s1 and 1131s2 of the layer 1131. In some embodiments, the pattern 113 defines a recess 113o recessed from the surface 112s1 of the dielectric layer 112. In some embodiments, the surface 1131s1 of the layer 1131 and the surface 1132s1 of the layer 1132 may define the recess 113o. In some embodiments, the surface 1132s1 of the layer 1132 is concave with respect to the surface 112s1 of the dielectric layer 112. The surface 1132s1 of the layer 1132 is concave with respect to the surface 1131s1 of the layer 1131. The layer 1132 may include conductive materials, such as copper, gold, tin, aluminum, silver, tungsten, nickel, or a combination thereof.

In some embodiments, the dielectric layer 112 (or the second region of the alignment structure 110B) and the pattern 113 (or the first region of the alignment structure 110B) may define a step structure or a step profile in the cross-section. In some embodiments, the surface 1132s1 of the pattern 113 and the surface 112s1 of the dielectric layer 112 form the step structure. In some embodiments, the preparation layer 170 may conformally cover the step structure on the side 110s1 of the substrate 110. In some embodiments, the pattern 113 and the preparation layer 170 are configured as a fiducial mark in a lithography operation for position-aligning. In some embodiments, the pattern 113 may include a pad.

In some embodiments, the preparation layer 170 is located above the alignment structure 110B. The preparation layer 170 may include an adhesion layer 171 and a seed layer 172. The adhesion layer 171 may be conformally disposed on the pattern 113 and the dielectric layer 112. In some embodiments, the adhesion layer 171 may be in contact with the surface 112s1 of the dielectric layer 112. In some embodiments, the adhesion layer 171 may be in contact with the surface 1131s1 of the layer 1131. In some embodiments, the adhesion layer 171 may be in contact with the surface 1131s2 of the layer 1131. In some embodiments, the adhesion layer 171 may be in contact with the surface 1132s1 of the layer 1132. In some embodiments, the adhesion layer 171 may be in contact with the encapsulant 140. In some embodiments, the adhesion layer 171 may include metal, metal nitride or other suitable materials. In some embodiments, the adhesion layer 171 may include titanium. In some embodiments, the thickness of the adhesion layer 171 may range from about 0.03 μm to about 2 μm.

In some embodiments, the seed layer 172 is located above the alignment structure 110B. The seed layer 172 may be conformally disposed on the adhesion layer 171. In some embodiments, the seed layer 172 may be in contact with the adhesion layer 171. In some embodiments, the seed layer 172 may be in contact with the conductive pillar 130. In some embodiments, the seed layer 172 may be in contact with the encapsulant 140. The seed layer 172 may have a surface 172s1 (or a bottom surface) contacting the adhesion layer 171. In some embodiments, the surface 172s1 of the seed layer 172 is lower than the surface 112s1 of the dielectric layer 112. In some embodiments, the surface 172s1 of the seed layer 172 is lower than the surface 1131s1 of the layer 1131. In some embodiments, the seed layer 172 may include conductive materials, such as copper. In some embodiments, the thickness of the seed layer 172 may be greater than that of the adhesion layer 171. In some embodiments, the thickness of the seed layer 172 may range from about 0.07 μm to about 3 μm. In some embodiments, the step height of the dielectric layer 112 and the pattern 113 may depend on the thickness of the preparation layer 170. In some embodiments, the step height may exceed 0.01 times the thickness of the preparation layer 170.

In some embodiments, the conductive pillar 130 may have a protruding portion 131 contacting the preparation layer 170. In some embodiments, the protruding portion 131 may fill the recess 113o of the pattern 113. In some embodiments, a bottom of the protruding portion 131 is lower than the surface 112s1 of the dielectric layer 112.

In some embodiments, the preparation layer 170 is formed by, for example, a sputter operation, a lithography operation and other suitable operations. The lithography operation may include an alignment operation in order to define the pattern of the preparation layer 170. In some embodiments, a planarization operation may be performed on the substrate 110 before bonding to the electronic component 120 to ensure that the side 110s1 of the substrate 110 may have a relatively smooth side 110s1 and a relatively small height difference (e.g., less than 0.005 μm) between the surface 112s1 of the dielectric layer 112 and the top surface of the pattern 113. Since the preparation layer 170 has a thickness exceeding or equaling 1 μm, the small height difference may cause the top surface of the preparation layer 170 to be too smooth, resulting in failure of the alignment operation during a lithography operation. In the embodiments of the present disclosure, the dielectric layer 112 and the pattern 113 define a step structure so that the preparation layer 170 can have a step height with relatively great difference. The step structure can serve as a fiducial mark to facilitate the alignment operation of a lithography operation. As a result, the pattern of the preparation layer 170 can be determined in the lithography operation.

Figure 3:
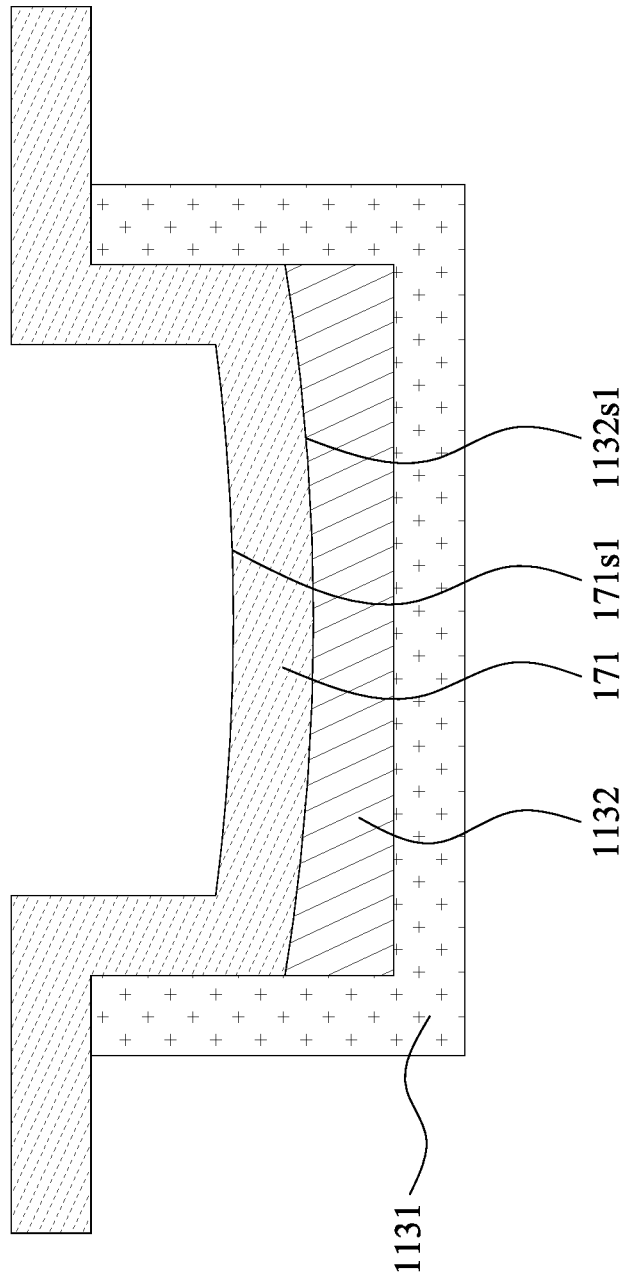
FIG. 3 is a cross-section of an exemplary electronic package structure according to some embodiments of the present disclosure.

FIG. 3 is a cross-section of an exemplary electronic package structure 100b according to some embodiments of the present disclosure. The electronic package structure 100b of FIG. 3 may have a structure similar to that of the electronic package structure 100a of FIG. 2 except that the surface 1132s1 of the layer 1132 may be concave with respect to the surface 112s1 of the dielectric layer 112. In some embodiments, the adhesion layer 171 may have a surface 171s1 (or a top surface) concave with respect to the surface 112s1 of the dielectric layer 112.

Figure 4:
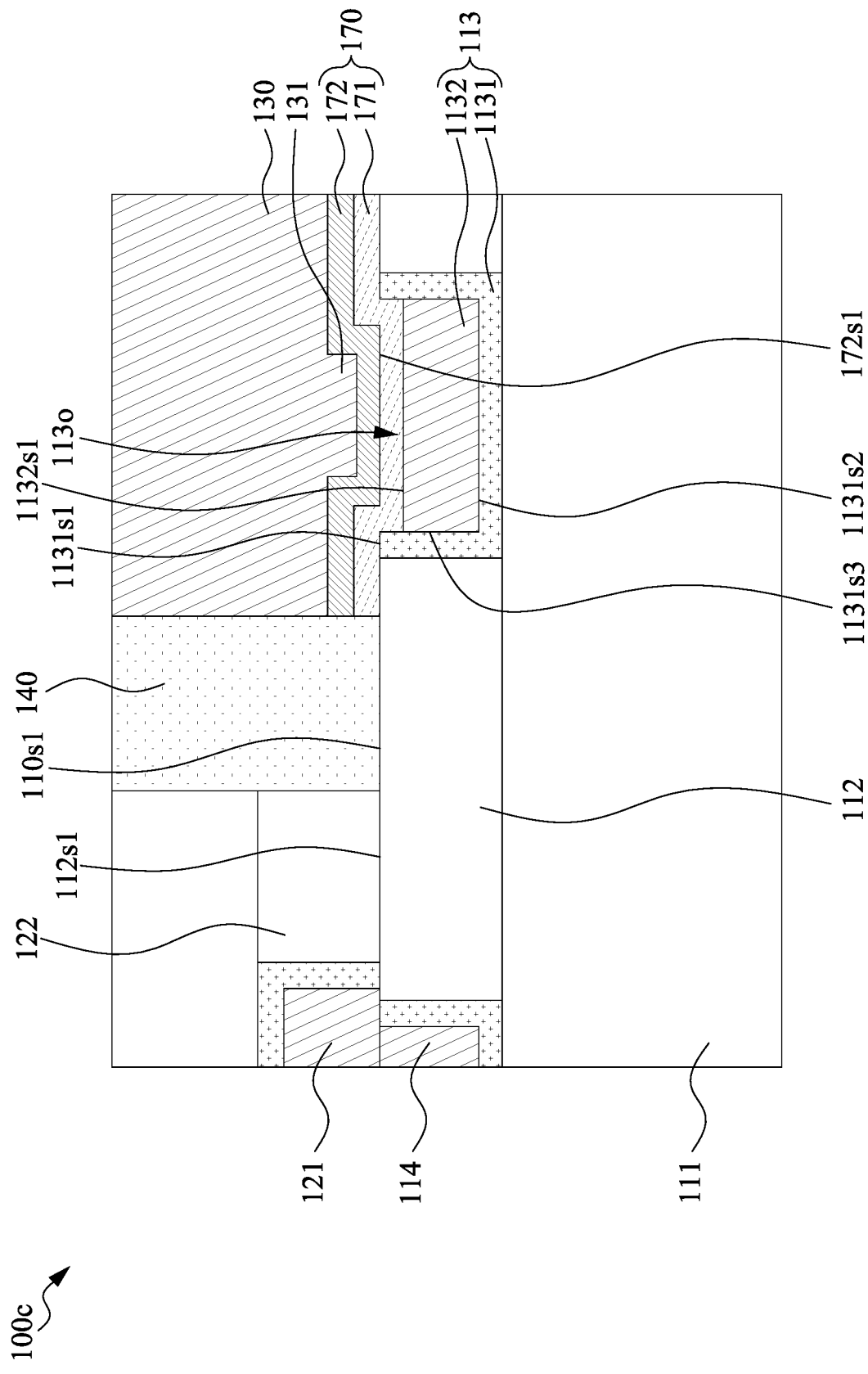
FIG. 4 is a cross-section of an exemplary electronic package structure according to some embodiments of the present disclosure.

FIG. 4 is a cross-section of an exemplary electronic package structure 100c according to some embodiments of the present disclosure. The electronic package structure 100c of FIG. 4 may have a structure similar to that of the electronic package structure 100a of FIG. 2 except that the surface 172s1 of the seed layer 172 may have an elevation equal to or higher than that of the surface 112s1 of the dielectric layer 112.

In some embodiments, the surface 172s1 of the seed layer 172 may be located at a horizontal level or top elevation the same as or higher than that of the surface 112s1 of the dielectric layer 112. In some embodiments, the surface 172s1 of the seed layer 172 may be located at a horizontal level or at a top elevation the same as or higher than that of the surface 1131s1 of the layer 1131. In some embodiments, the bottom of the protruding portion 131 of conductive pillar 130 is higher than the surface 112s1 of the dielectric layer 112. In the embodiments of the present disclosure, the dielectric layer 112 and the pattern 113 define a step structure so that the preparation layer 170 can have a step height with relatively great difference. The step structure can serve as a fiducial mark to facilitate the alignment operation of a lithography operation. As a result, the pattern of the preparation layer 170 can be determined in the lithography operation.

Figure 5:
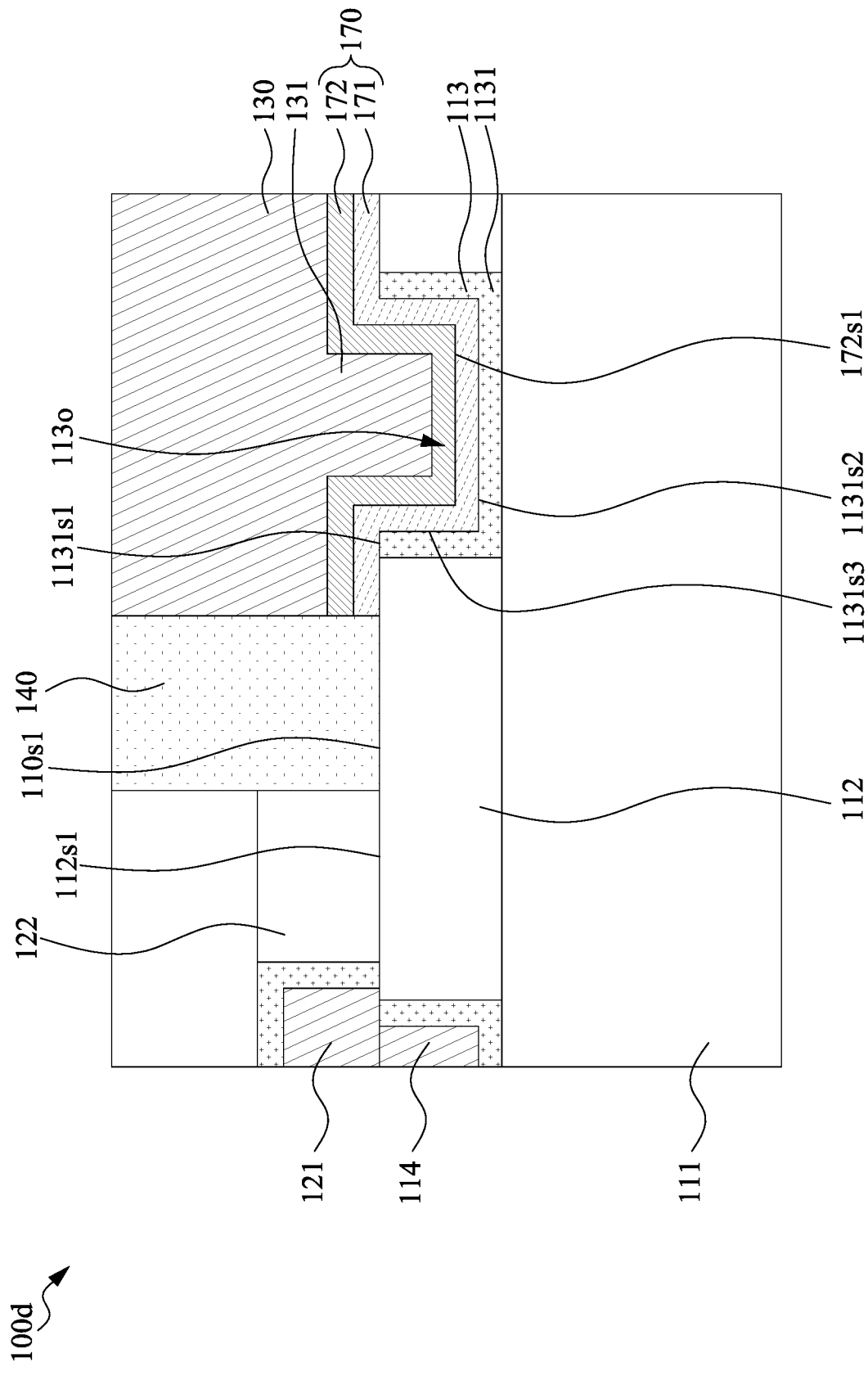
FIG. 5 is a cross-section of an exemplary electronic package structure according to some embodiments of the present disclosure.

FIG. 5 is a cross-section of an exemplary electronic package structure 100d according to some embodiments of the present disclosure. The electronic package structure 100d of FIG. 5 may have a structure similar to that of the electronic package structure 100a of FIG. 2 except that the seed layer 172 may be removed so that the adhesion layer 171 may be in contact with the surface 1131s2 of the layer 1131. In the embodiments of the present disclosure, the dielectric layer 112 and the pattern 113 define a step structure so that the preparation layer 170 can have a step height with relatively great difference. The step structure can serve as a fiducial mark to facilitate the alignment operation of a lithography operation. As a result, the pattern of the preparation layer 170 can be determined in the lithography operation.

Figure 6:
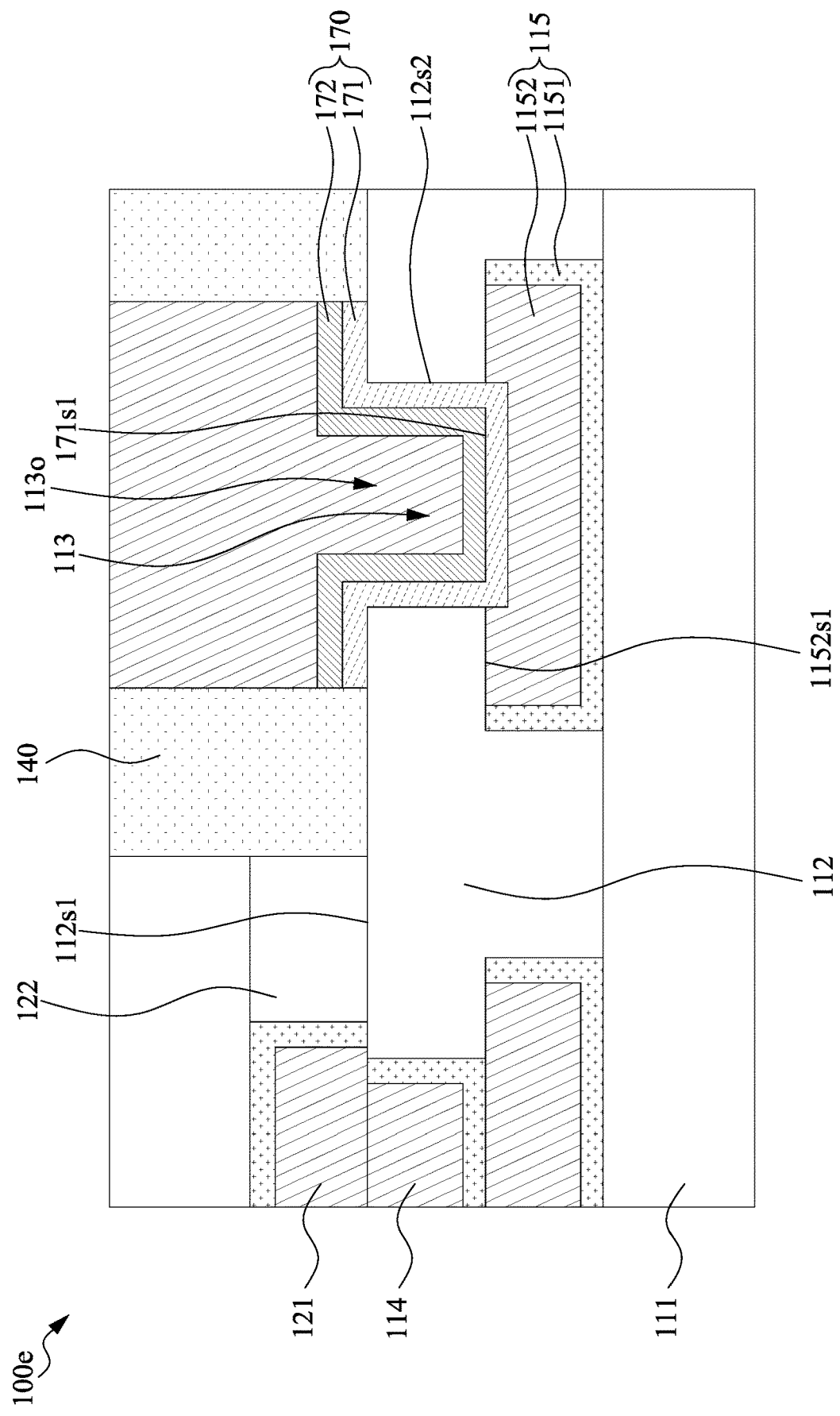
FIG. 6 is a cross-section of an exemplary electronic package structure according to some embodiments of the present disclosure.

FIG. 6 is a cross-section of an exemplary electronic package structure 100e according to some embodiments of the present disclosure. The electronic package structure 100e of FIG. 6 may have a structure similar to that of the electronic package structure 100a of FIG. 2 except that the electronic package structure 100e further includes a lower conductive trace 115.

In some embodiments, the layers 1131 and 1132 shown in FIG. 2 may be removed. In some embodiments, the pattern 113 may include a recess 113o in the dielectric layer 112. The recess 113o may expose the lower conductive trace 115. The recess 113o may expose a surface 112s2 (or a side surface) of the dielectric layer 112. The lower conductive trace 115 may be located lower than the pattern 114. The dielectric layer 112 may be around the lower conductive trace 115. The lower conductive trace 115 may include a layer 1151 and a layer 1152. The material of the layer 1151 may be the same as that of the layer 1131. The material of the layer 1152 may be the same as that of the layer 1132. In some embodiments, the preparation layer 170 may be in contact with the lower conductive trace 115. In some embodiments, the adhesion layer 171 may be in contact with the layer 1152 of the lower conductive trace 115. In some embodiments, a surface area of the lower conductive trace 115 may be greater than that of the preparation layer 170. For example, a surface area of the layer 1152s1 (or a top surface) of the layer 1152 may be greater than a surface area of the surface 171s1 of the adhesion layer 171. In some embodiments, the preparation layer 170 may penetrate a portion of the lower conductive trace 115. In some embodiments, the preparation layer 170 may penetrate a portion of the layer 1152 of the lower conductive trace 115. In some embodiments, the preparation layer 170 may be in contact with the surface 112s2 of the dielectric layer 112. In some embodiments, the adhesion layer 171 may be in contact with a surface 112s2 of the dielectric layer 112. In the embodiments of the present disclosure, the dielectric layer 112 and the pattern 113 (or the lower conductive trace 115) define a step structure so that the preparation layer 170 can have a step height with relatively great difference. The step structure can serve as a fiducial mark to facilitate the alignment operation of a lithography operation. As a result, the pattern of the preparation layer 170 can be determined in the lithography operation.

Figure 7:
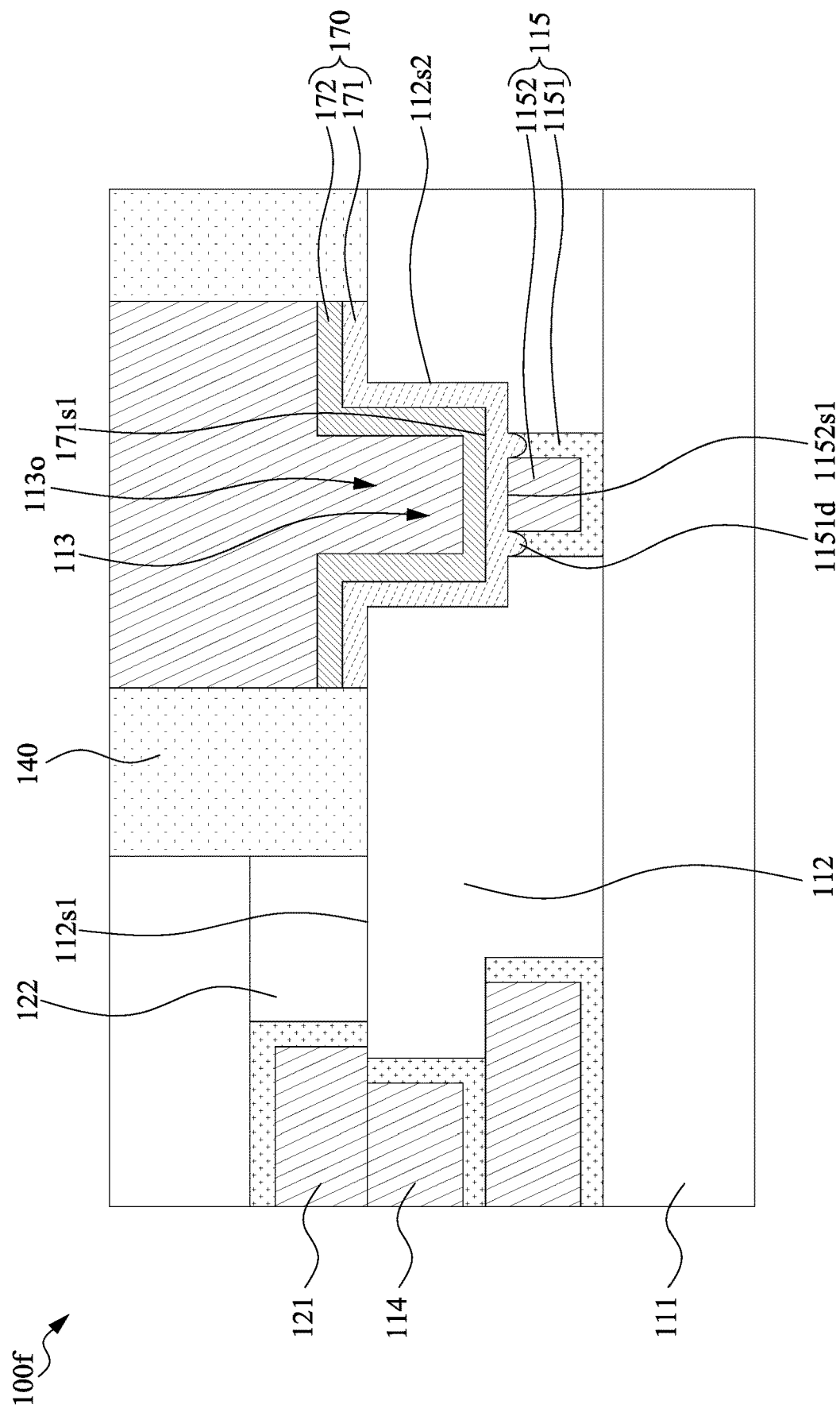
FIG. 7 is a cross-section of an exemplary electronic package structure according to some embodiments of the present disclosure.

FIG. 7 is a cross-section of an exemplary electronic package structure 100f according to some embodiments of the present disclosure. The electronic package structure 100f of FIG. 7 may have a structure similar to that of the electronic package structure 100e of FIG. 6 except that a surface area of the lower conductive trace 115 may be smaller than that of the preparation layer 170.

In some embodiments, a surface area of the layer 1152s1 of the layer 1152 may be smaller than a surface area of the surface 171s1 of the adhesion layer 171. In some embodiments, the layer 1152 may include a layer 1152d dimple filled by the preparation layer 170. In some embodiments, the layer 1151 may include a dimple 1151d filled by the adhesion layer 171. In the embodiments of the present disclosure, the dielectric layer 112 and the pattern 113 (or the lower conductive trace 115) define a step structure so that the preparation layer 170 can have a step height with relatively great difference. The step structure can serve as a fiducial mark to facilitate the alignment operation of a lithography operation. As a result, the pattern of the preparation layer 170 can be determined in the lithography operation.

Figure 8:
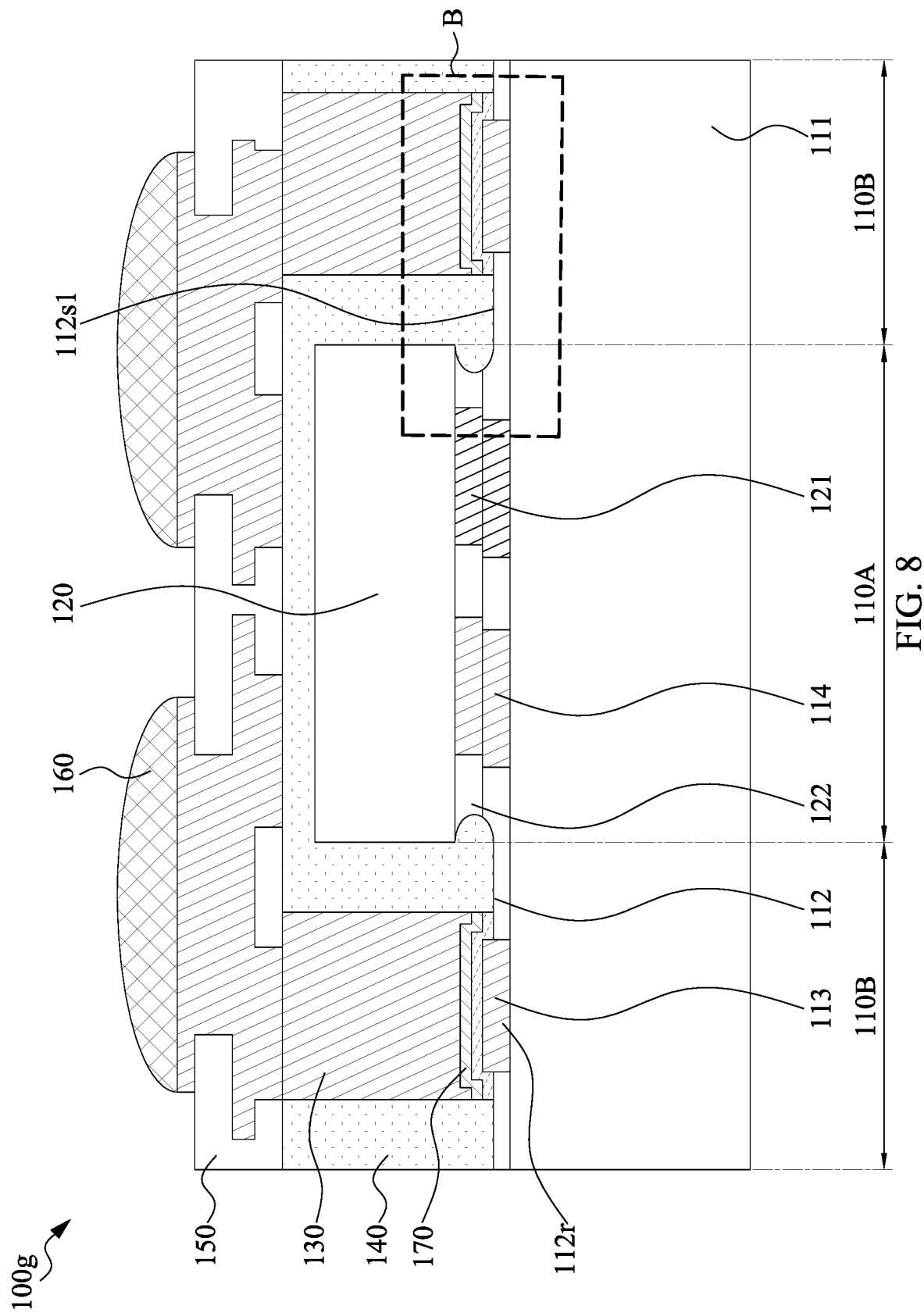
FIG. 8 is a cross-section of an exemplary electronic package structure according to some embodiments of the present disclosure.

FIG. 8 is a cross-section of an exemplary electronic package structure 100g according to some embodiments of the present disclosure. The electronic package structure 100g of FIG. 8 may have a structure similar to that of the electronic package structure 100a of FIG. 2 except that the surface 112s1 is lower than a top surface of the pattern 113.

Figure 9:
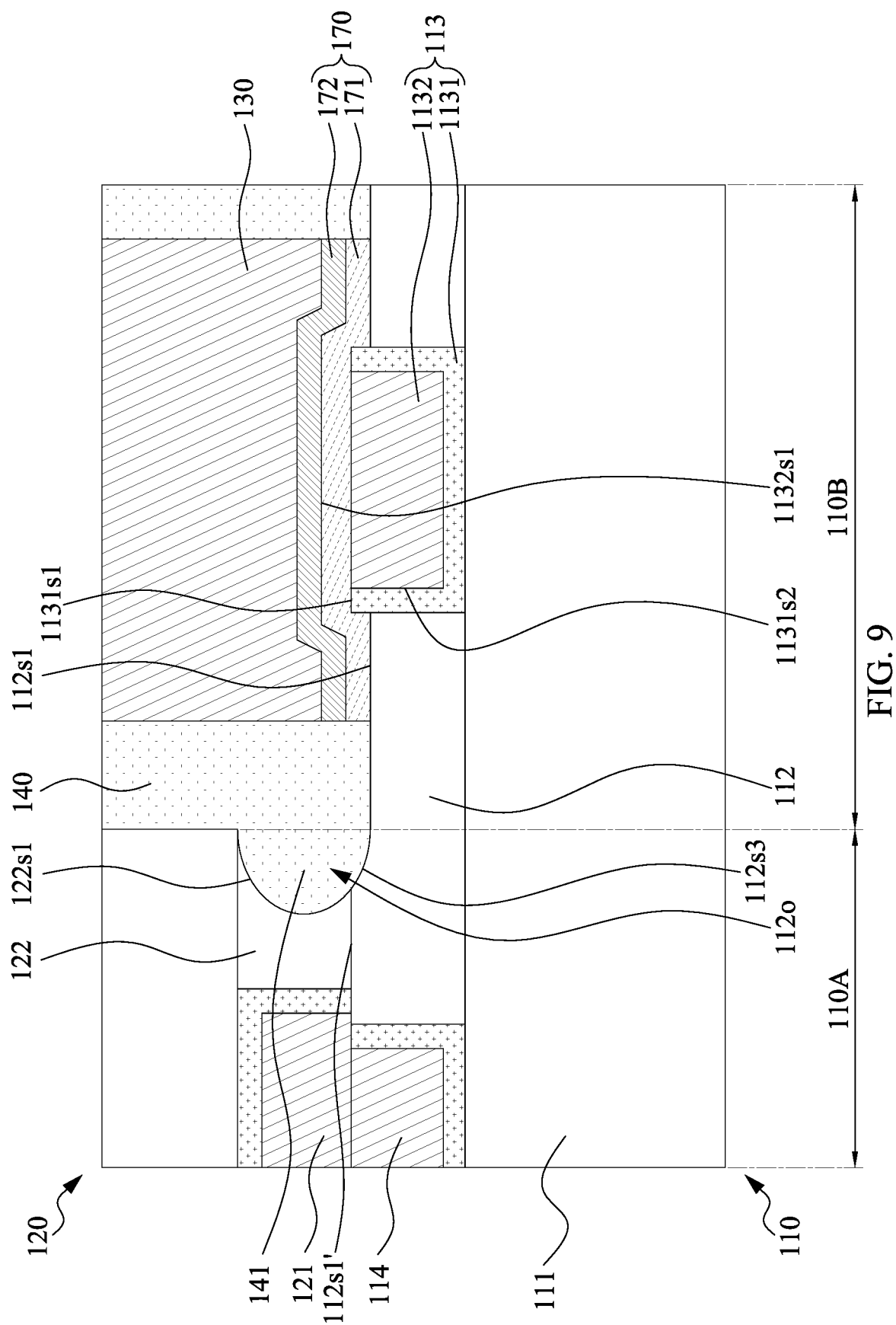
FIG. 9 is an enlarged view of region B of the electronic package structure as shown in FIG. 8, according to some embodiments of the present disclosure.

FIG. 9 is an enlarged view of region B of the electronic package structure 100g as shown in FIG. 8, according to some embodiments of the present disclosure.

In some embodiments, the surface 1132s1 of the layer 1132 may protrude from the surface 112s1 of the dielectric layer 112. In some embodiments, the surface 1132s1 of the layer 1132 may be higher than the surface 112s1 of the dielectric layer 112. In some embodiments, the surface 1131s1 of the layer 1131 may protrude from the surface 112s1 of the dielectric layer 112. That is, the first region (e.g., the pattern 113) of the alignment structure 110B has a horizontal level or top elevation higher than that of the second region (e.g., the dielectric layer 112) of the alignment structure 110B. In some embodiments, the surface 1132s1 of the layer 1132 may be substantially coplanar with the surface 1131s1 of the layer 1131. In some embodiments, the pattern 113 and the dielectric layer 112 may define a step structure. In some embodiments, the surface 1132s1 of the layer 1132, the surface 1131s1 of the layer 1131, and the surface 112s1 of the dielectric layer 112 form the step structure. In some embodiments, the surface 112s1 in the second region of the alignment structure 110B is lower than the surface 112s1' in the bonding region 110A. In some embodiments, a curved surface 112s3 is located between the surface 112s1' of the bonding region 110A and the surface 112s1 of the second region of the alignment structure 110B.

In some embodiments, the dielectric layers 112 and 122 may collaboratively define a dent 112o. The dent 112o may be under the electronic component 120. The encapsulant 140 may include a protruding portion 141 filling the dent 112o. In some embodiments, the protruding portion 141 may protrude toward the electronic component 120. In some embodiments, the protruding portion 141 may protrude toward the pattern 114 of the substrate 110. The dent 112o may cause the dielectric layers 112 and 122 to have a concave side surface 122s1. In some embodiments, the curved side surface may be in contact with the encapsulant 140. In the embodiments of the present disclosure, the dielectric layer 112 and the pattern 113 define a step structure so that the preparation layer 170 can have a step height with relatively great difference. The step structure can serve as a fiducial mark to facilitate the alignment operation of a lithography operation. As a result, the pattern of the preparation layer 170 can be determined in the lithography operation.

Figure 10:
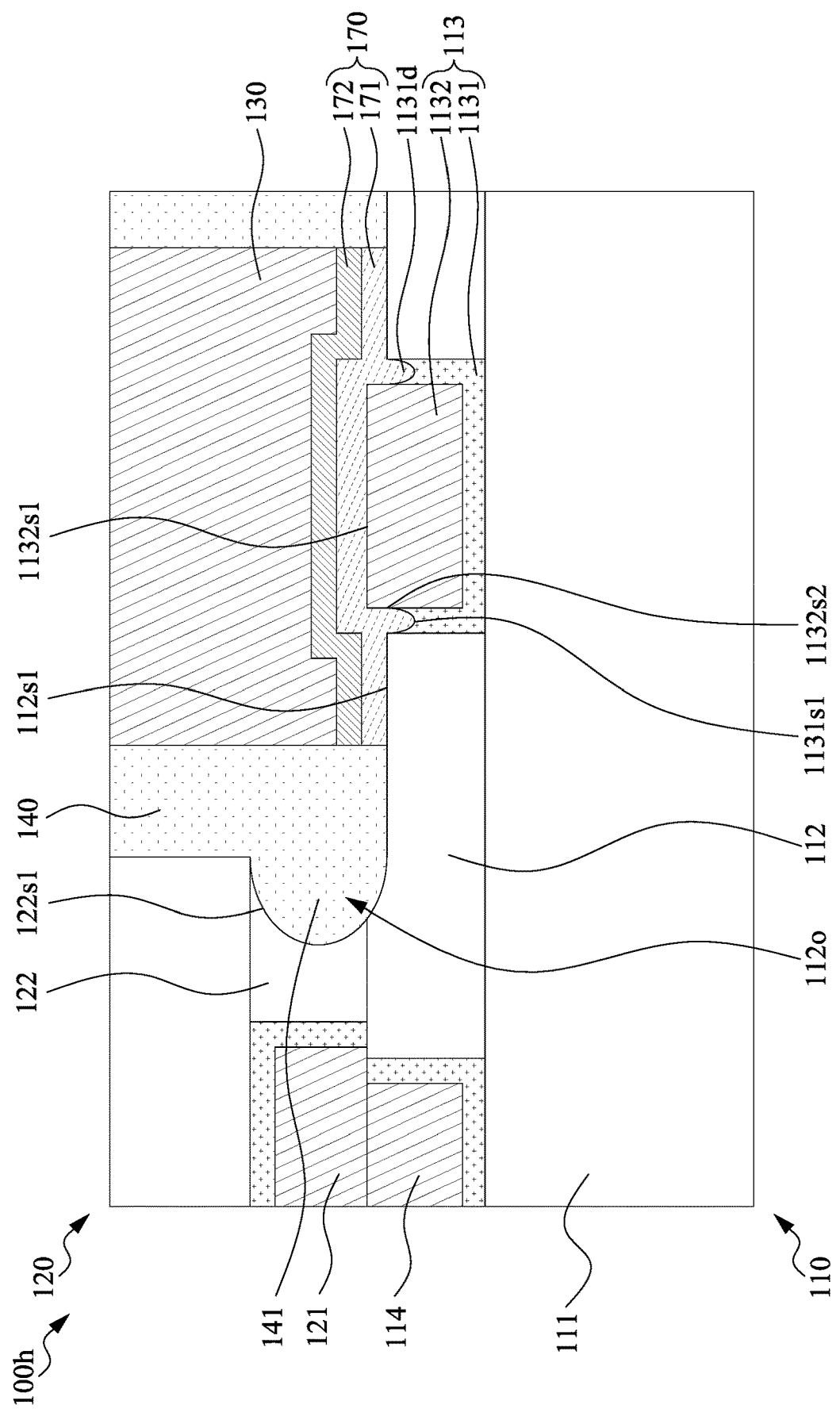
FIG. 10 is a cross-section of an exemplary electronic package structure according to some embodiments of the present disclosure.

FIG. 10 is a cross-section of an exemplary electronic package structure 100h according to some embodiments of the present disclosure. The electronic package structure 100h of FIG. 10 may have a structure similar to that of the electronic package structure 100g of FIG. 9 except that the surface 1131s1 of the layer 1131 may be lower than the surface 1132s1 of the layer 1132.

In some embodiments, the surface 1131s1 of the layer 1131 may be lower than the surface 112s1 of the dielectric layer 112. In some embodiments, the layer 1131 may include a dimple 1131d filled by the adhesion layer 171 of the preparation layer 170. In some embodiments, the layer 1132 may include a surface 1132s2 (or a side surface) in contact with the adhesion layer 171 of the preparation layer 170 and the layer 1132. In the embodiments of the present disclosure, the dielectric layer 112 and the pattern 113 define a step structure so that the preparation layer 170 can have a step height with relatively great difference. The step structure can serve as a fiducial mark to facilitate the alignment operation of a lithography operation. As a result, the pattern of the preparation layer 170 can be determined in the lithography operation.

Figure 11A:
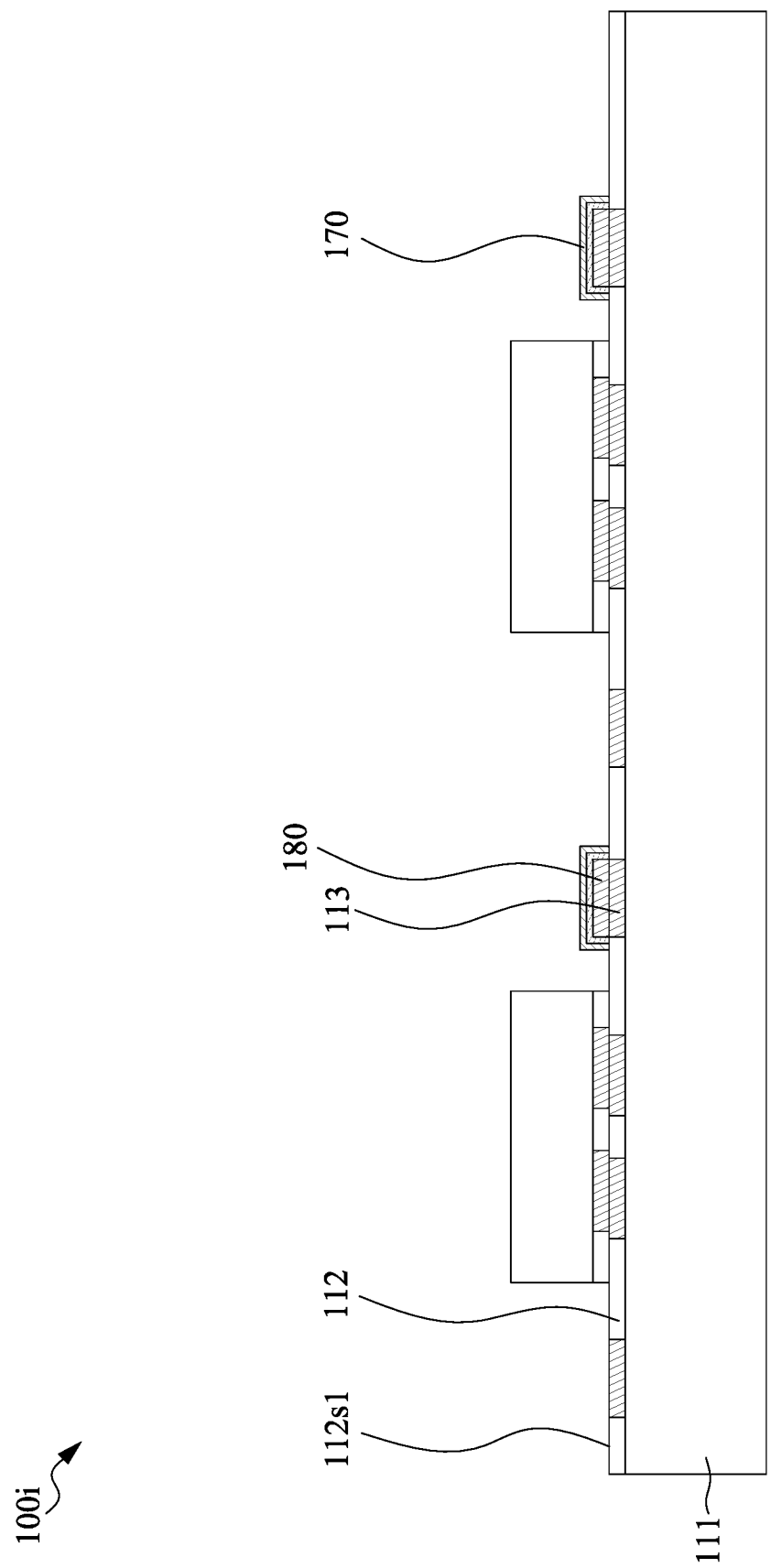
FIG. 11A is a cross-section of an exemplary electronic package structure according to some embodiments of the present disclosure.

FIG. 11A is a cross-section of an exemplary electronic package structure 100i according to some embodiments of the present disclosure.

In some embodiments, the pattern 113 may include a dummy pad 180 protruding from the surface 112s1 of the dielectric layer 112. The dummy pad 180 and the dielectric layer 112 may define a step structure. The preparation layer 170 may cover the dummy pad 180. The preparation layer 170 and the dummy pad 180 of the pattern 113 may be configured as a fiducial mark in a lithography operation. In the embodiments of the present disclosure, the dielectric layer 112 and the pattern 113 define a step structure so that the preparation layer 170 can have a step height with relatively great difference. The step structure can serve as a fiducial mark to facilitate the alignment operation of a lithography operation. As a result, the pattern of the preparation layer 170 can be determined in the lithography operation.

Figure 11B:
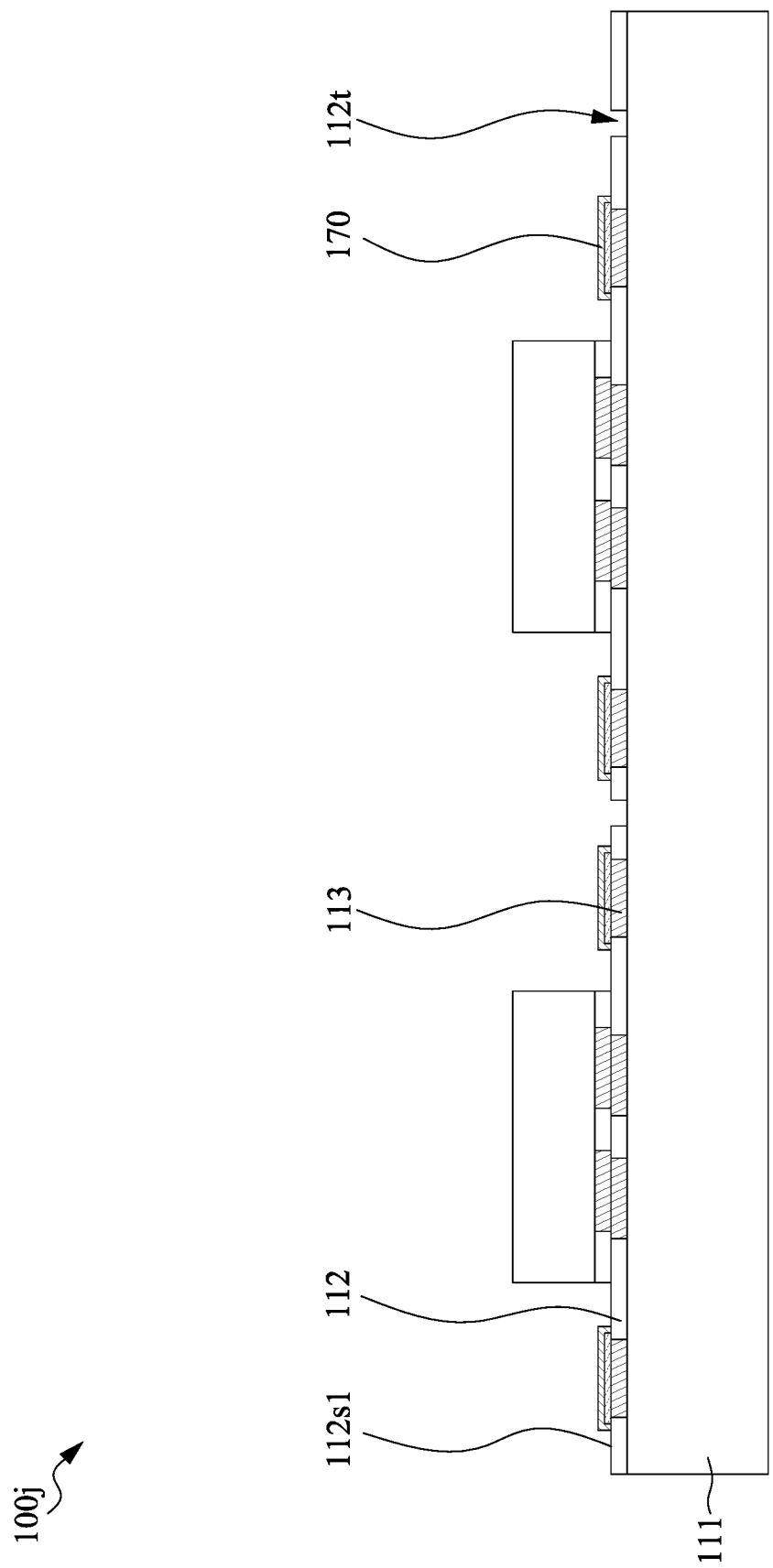
FIG. 11B is a cross-section of an exemplary electronic package structure according to some embodiments of the present disclosure.

FIG. 11B is a cross-section of an exemplary electronic package structure 100j according to some embodiments of the present disclosure. The electronic package structure 100j of FIG. 11B may have a structure similar to that of the electronic package structure 100i of FIG. 11A except that the electronic package structure 100j may include a trench 112t exposing the carrier 111. The trench 112t may be recessed from the surface 112s1 of the dielectric layer 112. The trench 112t may be spaced apart from the outer I/O (e.g., the pattern 113) of the substrate 110. The trench 112t may be adjacent to the outer I/O of the substrate 110. The trench 112t and the dielectric layer 112 may define a step structure. The step structure can serve as a fiducial mark. As a result, the pattern of the preparation layer 170 can be determined in the lithography operation.

FIG. 12A, FIG. 12B, FIG. 12C, FIG. 12D, and FIG. 12E illustrate various stages of an exemplary method for manufacturing an electronic package structure 100a according to some embodiments of the present disclosure.

Figure 12A:
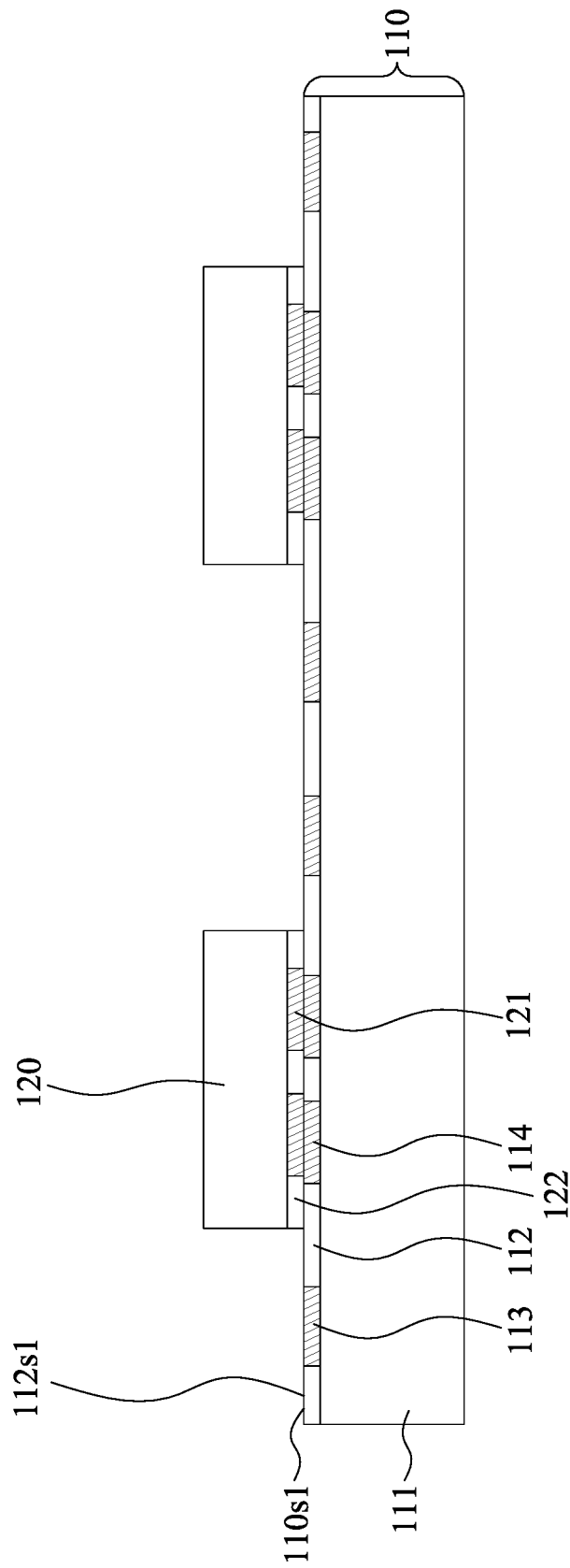
FIG. 12A, FIG. 12B, FIG. 12C, FIG. 12D, and FIG. 12E illustrate various stages of an exemplary method for manufacturing an electronic package structure according to some embodiments of the present disclosure.

Referring to FIG. 12A, an electronic package is provided. The electronic package may include a plurality of package units. The electronic package may include a substrate 110 and an electronic component 120. In some embodiments, the electronic component 120 is hybrid bonded to the substrate 110. The substrate 110 may have a pattern 113 exposed by the electronic component 120. In some embodiments, a chemical mechanical polishing (CMP) operation is performed on the hybrid bonding surface of the substrate 110 prior to the hybrid bonding. The CMP operation may include planarizing the dielectric layer 112, the pattern 113 and the pattern 114 such that the dielectric layer 112, the pattern 113, and the pattern 114 may be substantially coplanar with each other.

Figure 12B:
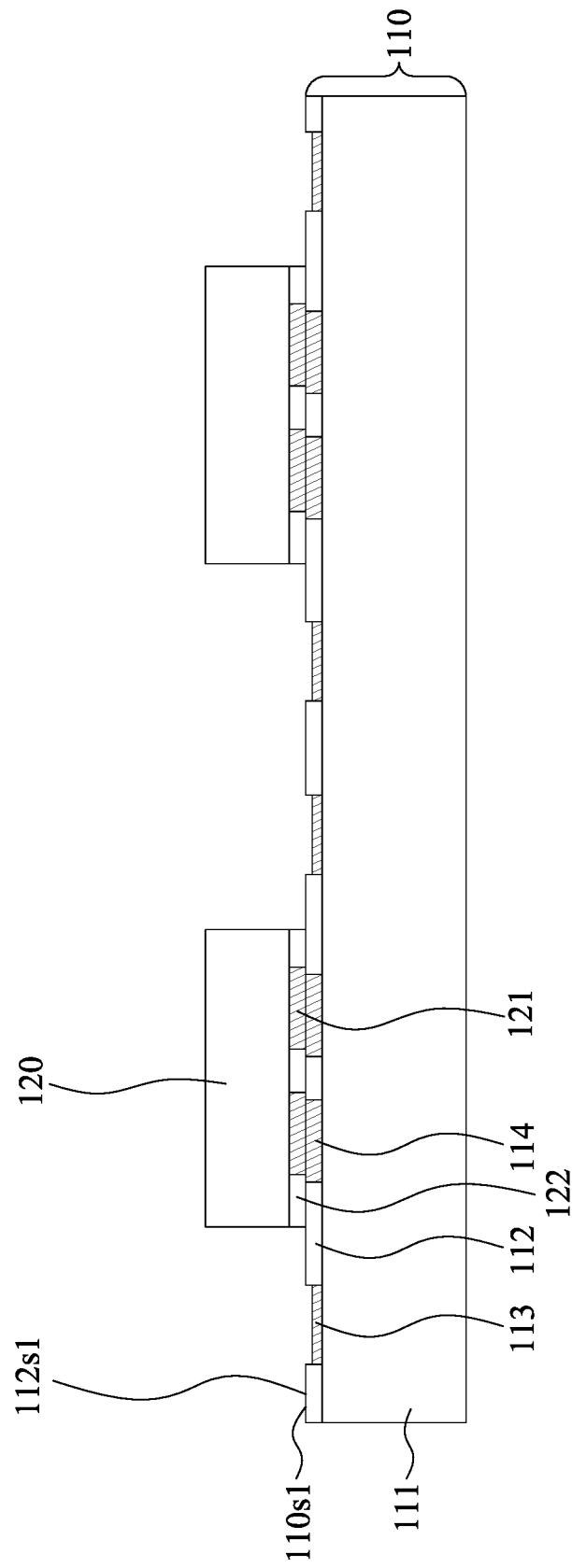

Referring to FIG. 12B, a surface-treating operation is performed on the side 110s1 of the substrate 110. In some embodiments, the surface-treating operation may include etching the pattern 113. As a result, the pattern 113 may be recessed from a surface 112s1 of the dielectric layer 112 to form a step structure.

Figure 12C:
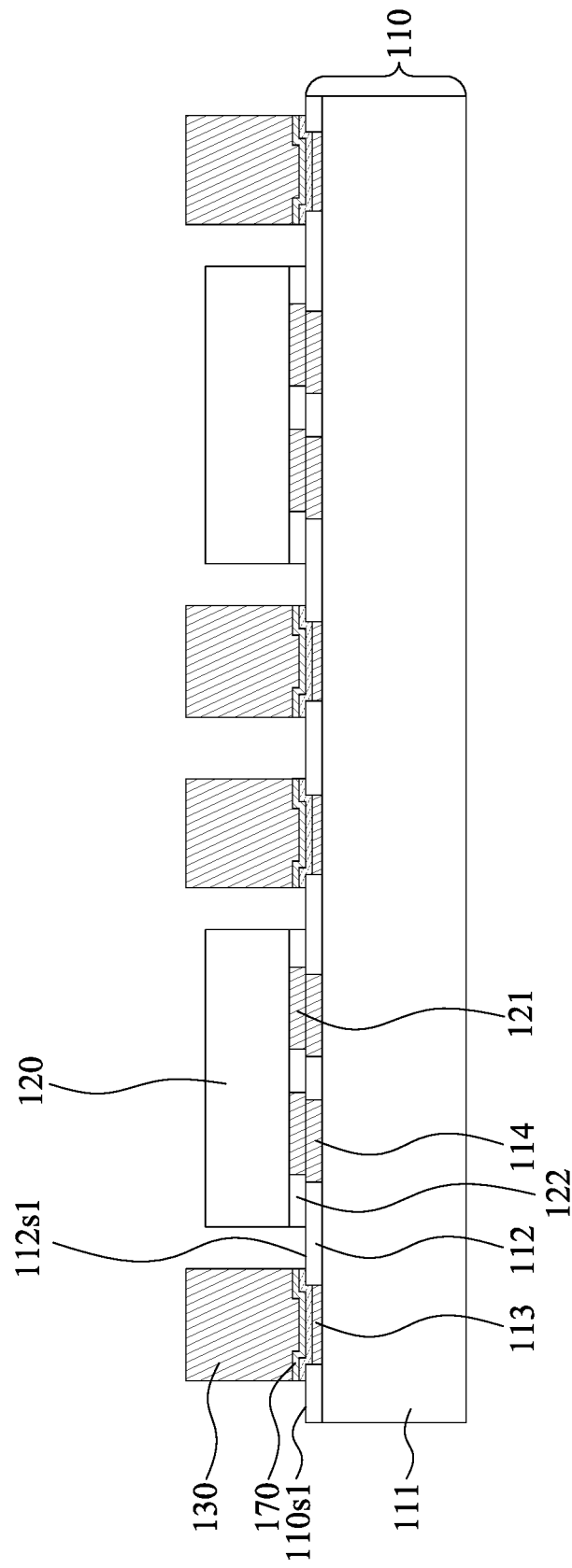

Referring to FIG. 12C, a preparation layer 170 may be formed on the pattern 113. The preparation layer 170 may conformally cover the step structure on the side 110s1 of the substrate 110. In some embodiments, a step height of the step structure may depend on the thickness of the preparation layer 170. In some embodiments, the step height may be greater than 0.01 times of the thickness of the preparation layer 170. In some embodiments, the preparation layer 170 may be formed by a sputter operation, a lithography operation and other suitable operations. In some embodiments, during a lithography operation, the stop profile structure of the dielectric layer 112 and the pattern 113 is identified for alignment. After the preparation layer 170 is formed, a conductive pillar 130 may be formed on the preparation layer 170. The conductive pillar 130 may be formed, for example, by an electroplating operation.

Figure 12D:
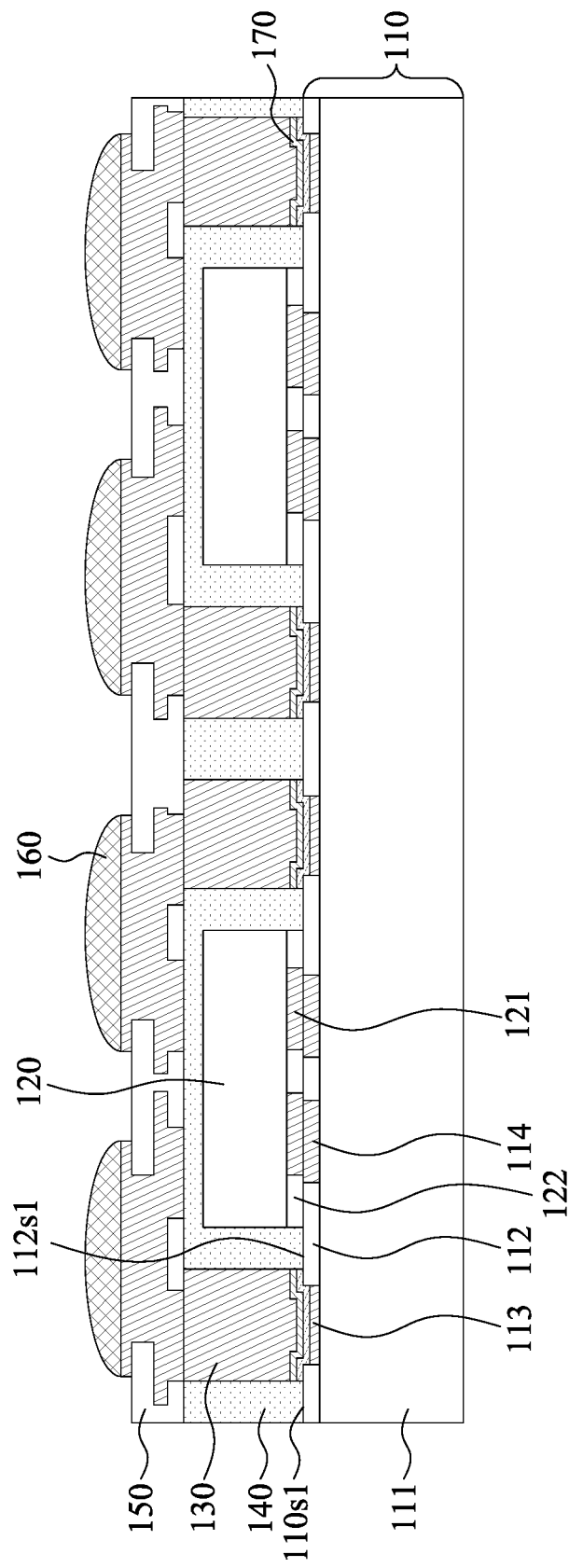

Referring to FIG. 12D, an encapsulant 140, a redistribution structure 150, and an electrical connector 160 may be formed. The encapsulant 140 may encapsulate the electronic component 120 and the conductive pillar 130. The redistribution structure 150 may be formed on the encapsulant 140. The electrical connector 160 may be formed on the redistribution structure 150.

Figure 12E:
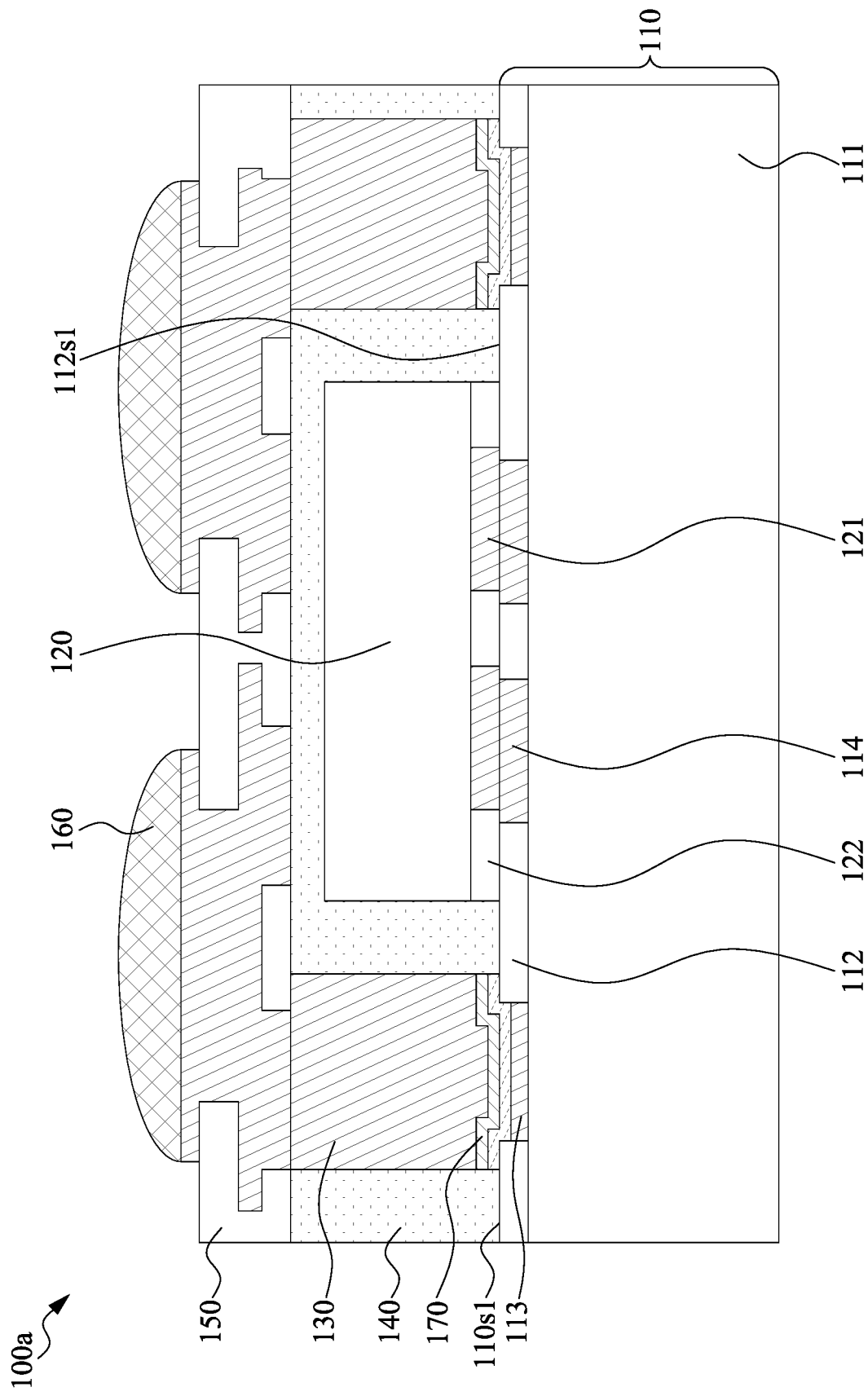

Referring to FIG. 12E, the electronic package is singulated to separate the plurality of package units. As a result, a plurality of the electronic package structure 100a may be produced.

In the embodiments of the present disclosure, a step structure of the dielectric layer 112 and the pattern 113 is formed before a lithography operation for forming the preparation layer 170. The step structure is defined by a step difference between the dielectric layer 112 and the pattern 113, and can be identified during forming the preparation layer 170 to facilitate the alignment operation of the lithography operation. As a result, the pattern of the preparation layer 170 can be determined.

FIG. 13A, FIG. 13B, FIG. 13C, FIG. 13D, and FIG. 13E illustrate various stages of an exemplary method for manufacturing an electronic package structure 100g according to some embodiments of the present disclosure.

Figure 13A:
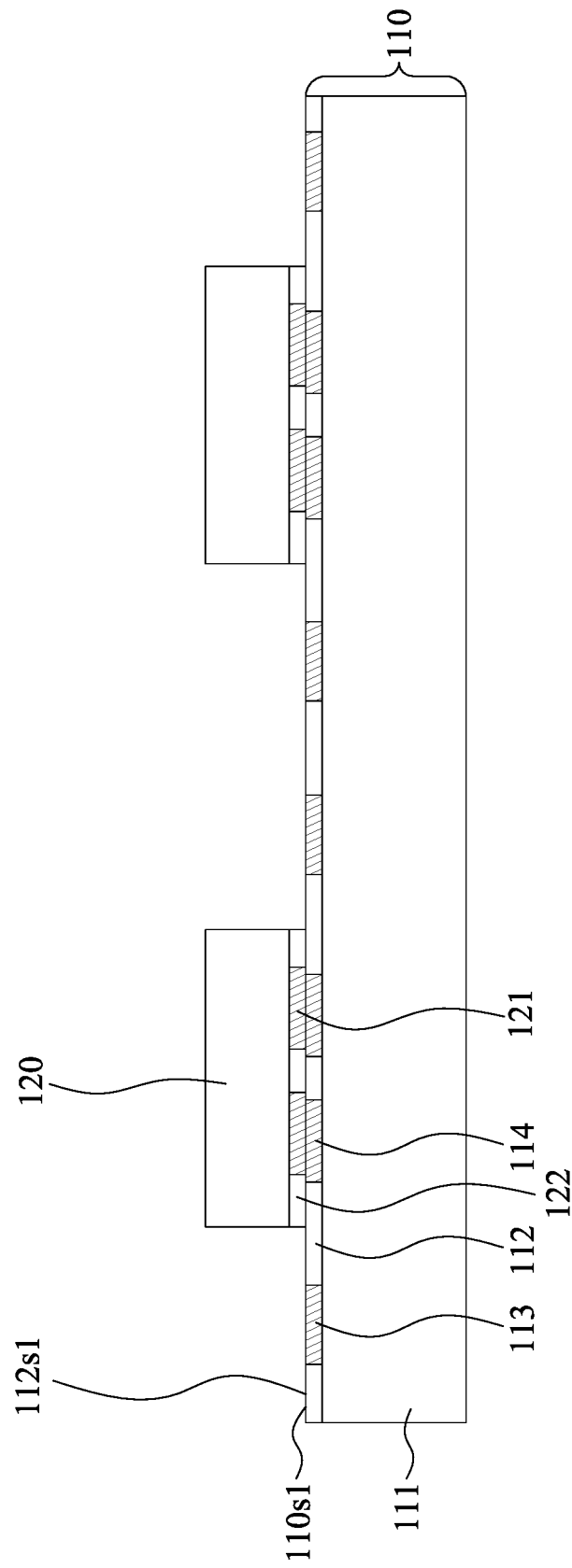
FIG. 13A, FIG. 13B, FIG. 13C, FIG. 13D, and FIG. 13E illustrate various stages of an exemplary method for manufacturing an electronic package structure according to some embodiments of the present disclosure.

Referring to FIG. 13A, an electronic package is provided. The electronic package may include a plurality of package units. The electronic package may include a substrate 110 and an electronic component 120. In some embodiments, the electronic component 120 is hybrid bonded to the substrate 110. In some embodiments, a CMP operation is performed on the hybrid bonding surface such that the dielectric layer 112, the pattern 113, and the pattern 114 may be substantially coplanar with each other.

Figure 13B:
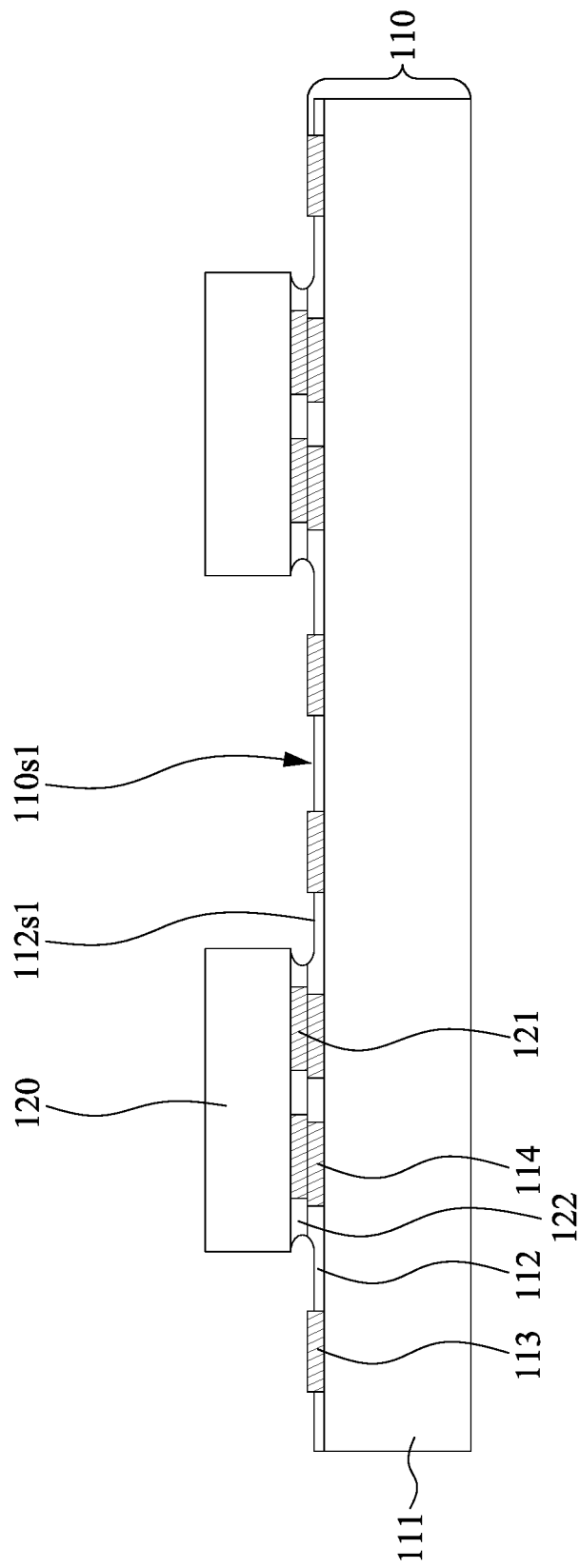

Referring to FIG. 13B, a surface-treating operation is performed on the side 110s1 of the substrate 110. In some embodiments, the surface-treating operation may include etching the dielectric layer 112 such that the surface 112s1 of the dielectric layer 112 may be recessed from the pattern 113. As a result, a step structure is formed.

Figure 13C:
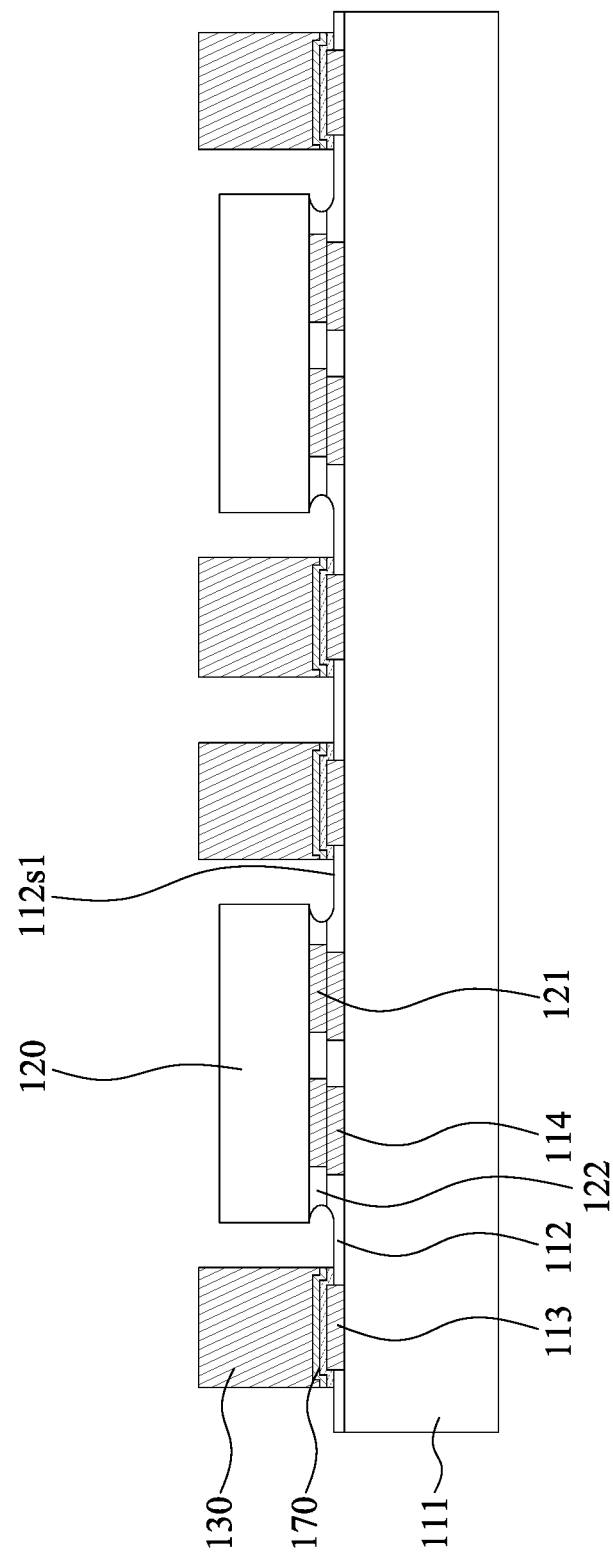

Referring to FIG. 13C, a preparation layer 170 may be formed on the pattern 113. The preparation layer 170 may conformally cover the step structure on the side 110s1 of the substrate 110. In some embodiments, the step height may exceed 0.01 times the thickness of the preparation layer 170. In some embodiments, during a lithography operation, the stop profile structure of the dielectric layer 112 and the pattern 113 is identified for alignment. After the preparation layer 170 is formed, a conductive pillar 130 may be formed on the preparation layer 170. The conductive pillar 130 may be formed, for example, by an electroplating operation.

Figure 13D:
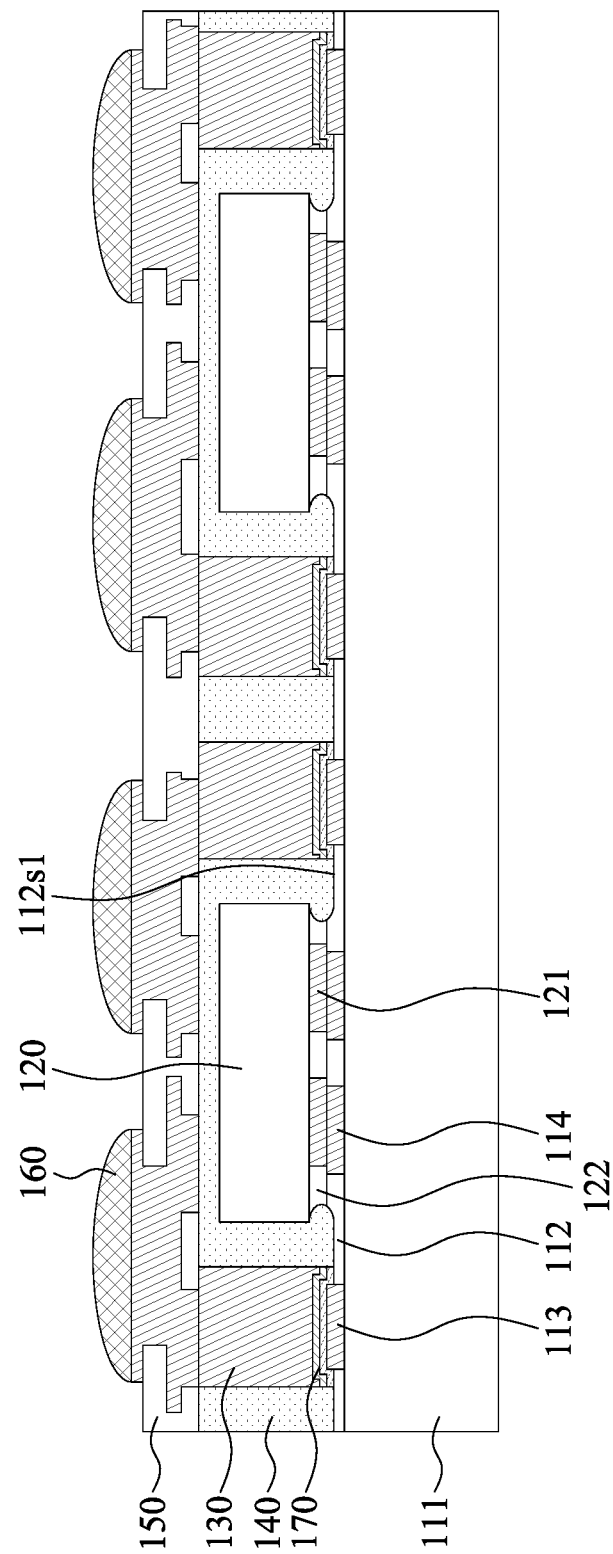

Referring to FIG. 13D, an encapsulant 140, a redistribution structure 150, and an electrical connector 160 may be formed. The encapsulant 140 may encapsulate the electronic component 120 and the conductive pillar 130. The redistribution structure 150 may be formed on the encapsulant 140. The electrical connector 160 may be formed on the redistribution structure 150.

Figure 13E:
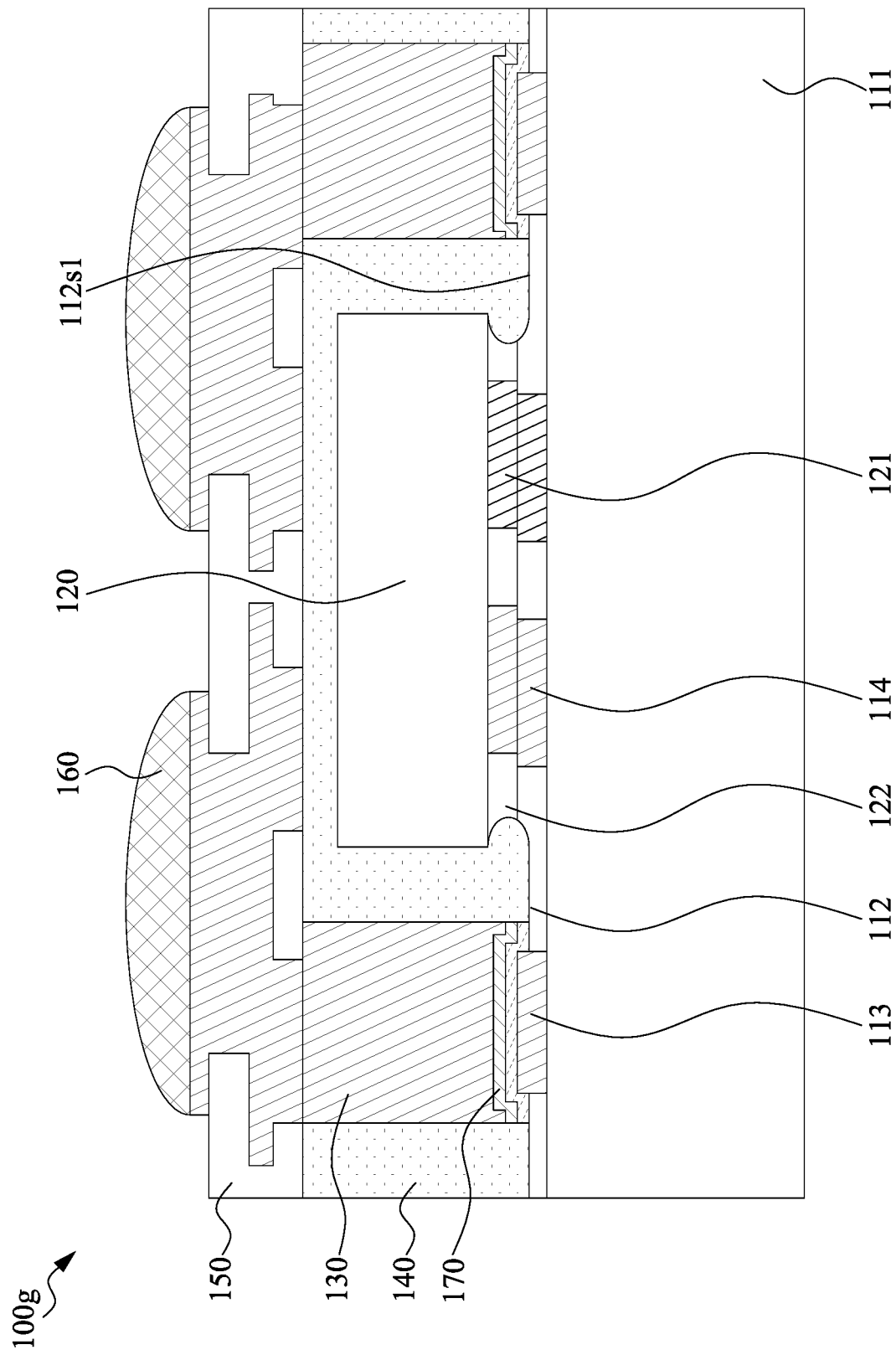

Referring to FIG. 13E, the electronic package structure is singulated to separate the plurality of package units. As a result, a plurality of the electronic package structure 100g may be produced.

In the embodiments of the present disclosure, a step structure is formed. The step structure is defined by a step difference between the dielectric layer 112 and the pattern 113, and can be identified during forming the preparation layer 170 to facilitate the alignment operation of the lithography operation. As a result, the pattern of the preparation layer 170 can be determined.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic package structure, comprising:
   a substrate, comprising:
      a bonding region located at a side of the substrate and bonded with an electronic component; and
      an alignment structure located at the side of the substrate and out of the bonding region and configured to providing a fiducial mark for position-aligning,
   wherein the alignment structure comprises a first region and a second region visually distinct from the first region, the first region has a top elevation lower than that of the second region, and a top surface of the first region has a curved surface.

2. The electronic package structure of claim 1, wherein the first region has a top elevation higher than that of the second region.

3. The electronic package structure of claim 1, wherein the second region has an elevation lower than that of the bonding region.

4. An electronic package structure, comprising:
   a substrate, comprising:
      a bonding region located at a side of the substrate and bonded with an electronic component;
      an alignment structure located at the side of the substrate and out of the bonding region and configured to providing a fiducial mark for position-aligning, wherein the alignment structure comprises a first region and a second region visually distinct from the first region, the second region has an elevation lower than that of the bonding region; and
   a curved surface between a surface of the second region and a surface of the bonding region.

5. The electronic package structure of claim 1, wherein the electronic component comprises an interconnector and a dielectric layer around the interconnector, the interconnector is in contact with a pad of the bonding region, and the dielectric layer of the electronic component is in contact with a second dielectric layer of the bonding region.

6. The electronic package structure of claim 1, further comprising:
   a pillar formed over the alignment structure.

7. The electronic package structure of claim 1, further comprising:
   a seed layer on the alignment structure.

8. The electronic package structure of claim 4, wherein a height of the curved surface is closer to a height of the second region than to a height of the bonding region.

9. The electronic package structure of claim 1, wherein the second region has an opening exposing the first region, and an inner side surface of the opening is substantially aligned with a side surface of the first region.

10. The electronic package structure of claim 9, wherein the first region and the second region collaboratively define a step structure.

11. The electronic package structure of claim 1, wherein the first region further comprises a pad configured to electrically connect an exterior circuit with the substrate.

* * * * *